(12) United States Patent
Meninger

(10) Patent No.: US 8,471,601 B2
(45) Date of Patent: Jun. 25, 2013

(54) SINGLE-ENDED TO DIFFERENTIAL CONVERTER

(75) Inventor: Scott Meninger, Lancaster, MA (US)

(73) Assignee: Cavium, Inc., San Jose, CA (US)

( * ) Notice: Subject to any disclaimer, the term of this patent is extended or adjusted under 35 U.S.C. 154(b) by 453 days.

(21) Appl. No.: 12/214,789

(22) Filed: Jun. 20, 2008

(65) Prior Publication Data

US 2009/0315602 A1    Dec. 24, 2009

(51) Int. Cl.
*H03K 3/00* (2006.01)

(52) U.S. Cl.
USPC .......................................... 327/108; 327/112

(58) Field of Classification Search
USPC .............. 327/108–112, 333, 318, 359, 543; 326/80–83, 87; 330/301, 253, 261, 302
See application file for complete search history.

(56) References Cited

U.S. PATENT DOCUMENTS

| | | | |
|---|---|---|---|
| 5,742,183 A * | 4/1998 | Kuroda | 326/81 |
| 5,945,878 A | 8/1999 | Westwick et al. | |
| 6,606,489 B2 | 8/2003 | Razavi et al. | |
| 6,686,747 B2 | 2/2004 | Morgan | |
| 7,279,937 B2 * | 10/2007 | Aliahmad et al. | 326/115 |
| 2007/0018684 A1 * | 1/2007 | Pan et al. | 326/32 |
| 2008/0159412 A1 * | 7/2008 | Drost | 375/257 |
| 2008/0309395 A1 * | 12/2008 | Kaneko et al. | 327/333 |

* cited by examiner

*Primary Examiner* — Kenneth B. Wells
(74) *Attorney, Agent, or Firm* — Hamilton, Brook, Smith & Reynolds, P.C.

(57) ABSTRACT

A single-ended to differential converter is presented. The converter may be configured to convert full-swing single-ended signals to low-swing differential signals within a single-stage, thereby reducing signal distortion. The converter may include a passive network of resistive elements, for example resistors and/or metal oxide semiconductor (MOS) devices operating in a linear region. The converter may also allow for adjustable design parameters such as a common mode, differential amplitude, and an output swing. The adjustments may all be made within the single-stage of the converter.

24 Claims, 20 Drawing Sheets

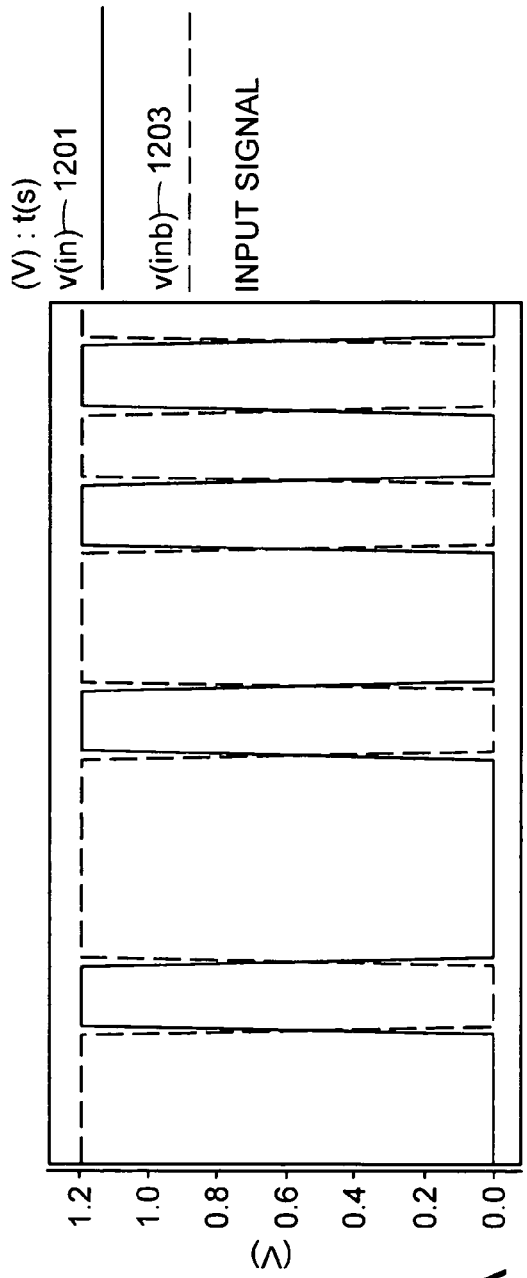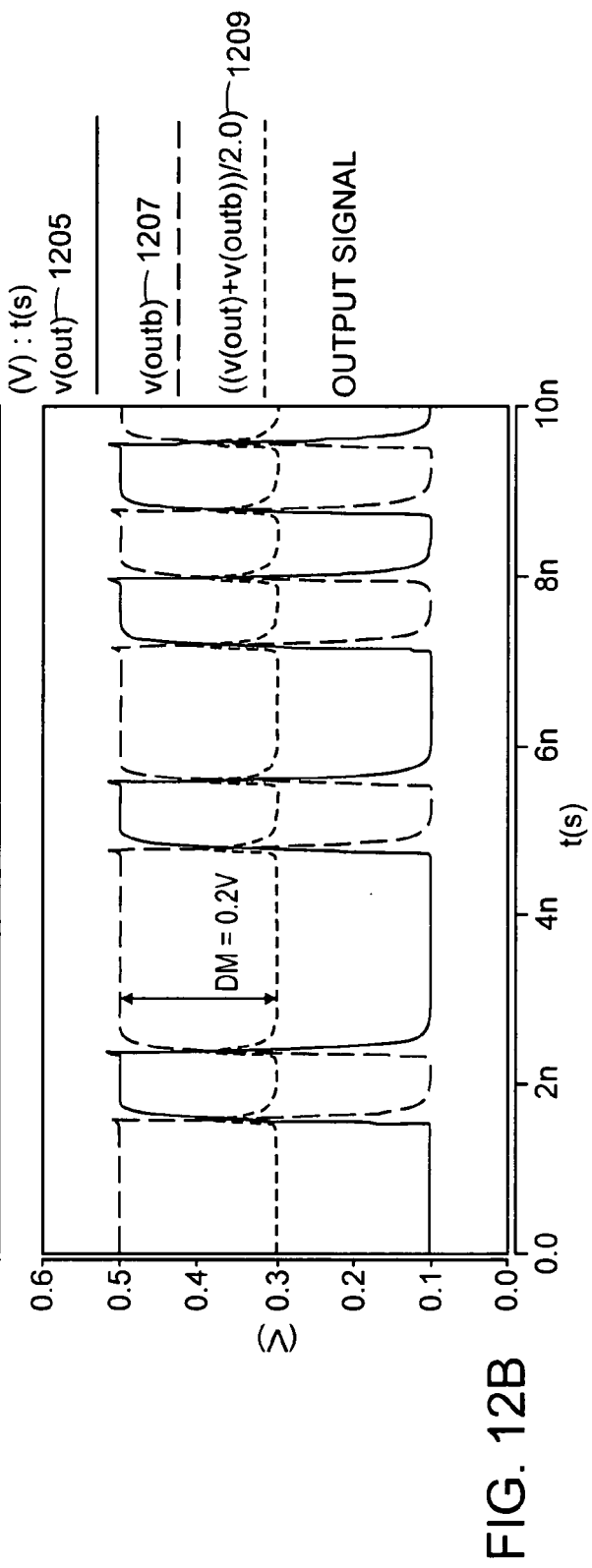
FIG. 12A
FIG. 12B

SINGLE-ENDED TO DIFFERENTIAL CONVERTER

BACKGROUND

In modern high speed mixed signal integrated circuit design, there is often a need to cross signaling domains and go from full-swing single-ended signals to low-swing differential signals. Circuits that act as intermediaries between these domains are known as level converters. Level converters typically include multiple stages as well as a variety of active circuit components.

SUMMARY

In example embodiments, a single-stage converter featuring a passive network of resistive elements is presented. The passive single-stage converter may reduce signal distortion and design complexities associated with prior art converter systems. The single-stage converter, and corresponding method, of example embodiments may include at least one input node configured to receive a full-swing single-ended signal, at least one output node configured to emit a low-swing differential signal, and a single-stage circuit that may be coupled between the at least one input and output nodes. The single-stage circuit may be configured to convert the full-swing single-ended signal to the low-swing differential signal.

The single-stage circuit may feature a fully passive network of a plurality of resistive elements. The resistive elements may include resistors and/or metal oxide semiconductor (MOS) devices operating in a linear region. At least one variable current source may be in connection with the resistive network to further define a common mode of the low-swing differential signal. The at least one variable current source may be a MOS device or a resistor. Characteristics of the low-swing differential signal, for example the common mode, output swing, and differential amplitude, may be defined and/or adjustable via a ratio with respect to at least a portion of the plurality of resistive elements. Furthermore, adjustments to the common mode may be independent of the output swing.

The resistive network may include two receiving resistive elements in connection with the at least one input node, at least one emitting resistive element in connection with the at least one output node, and at least one variable current source for defining the common mode voltage of the low-swing differential signal. The at least one variable current source may be resistor or a MOS device. Furthermore, the receiving and/or emitting resistive elements may be in the form of a bank of resistive elements.

The plurality of resistive elements may include at least one setting resistive element connected to a voltage source. The at least one setting resistive element may be configured to provide a decrease to a common mode of the low-swing differential signal to an amount less than half of a high voltage of the full-swing single-ended signal. Alternatively, the at least one setting resistive element may be configured to provide an increase to the common mode of the low-swing differential signal to at amount greater than half of the high voltage.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIGS. 12A and 12B illustrate simulation results of the SE2DC of FIG. 9B, 9D, or 10;

DETAILED DESCRIPTION

A description of example embodiments of the invention follows.

When signals are transferred from full-swing single-ended circuitry to low-swing differential circuitry, there is often a need to transition signal levels from the single-ended full-swing domain to the low-swing differential domain. This might be the case at the chip-package boundary, where full-swing on-chip signals are to be sent to a board in an LVDS (low swing, differential signaling) fashion. It might also be the case on chip where high speed signals are distributed over long distances on-chip, or in a feedback circuit where the duty cycle of the full-swing signal is to be measured, and may be converted to a differential signal to drive an on-chip differential integrator.

Differential circuits may be, by their nature, designed for input swings that are not full-swing, but some fraction of the full supply range. The low-swing differential signal amplitude and common mode (average) voltage values are key design parameters that are tailored to meet the need of the differential circuit.

Figure 1:
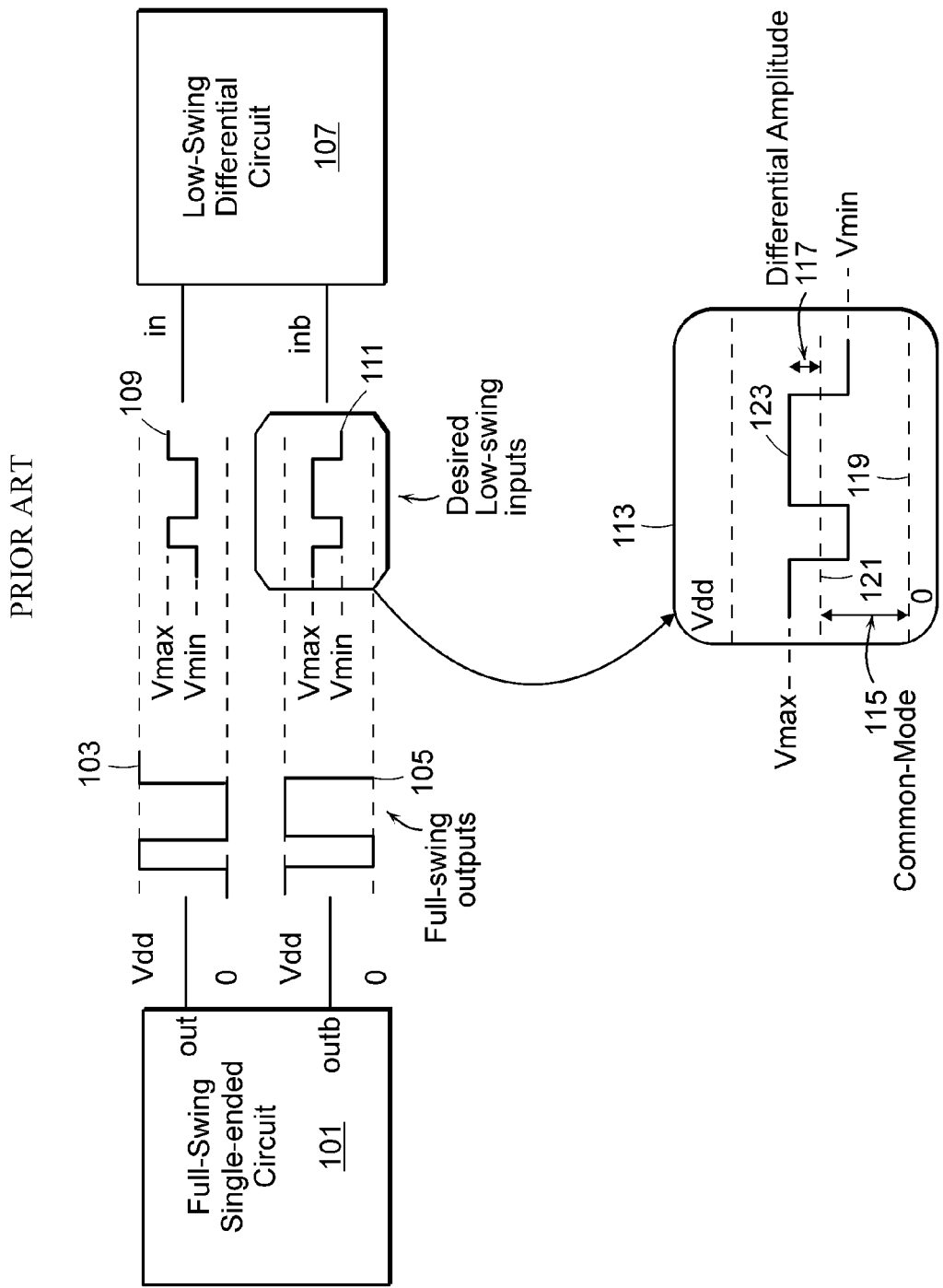
FIG. 1 illustrates an overview of challenges in converting mixed signals.

FIG. 1 provides an overview of mixed signal conversion. Full-swing single-ended circuitry 101 typically outputs a full-swing signal 103 and a corresponding inverted signal 105. The signals 103 and 105 typically range in voltage values from a high voltage value, or Vdd (e.g., the value of the source voltage) to a low voltage value, or 0V (e.g., ground).

FIG. 1 also illustrates low-swing differential circuitry 107 that may input a low-swing signal 109 and a corresponding inverted signal 111. The signals 107 and 109 may range in voltage values from Vmax (e.g., a lesser value of the source voltage Vdd) to Vmin (e.g., a corresponding lesser and inverted value of the source voltage Vdd).

As shown by expanded window 113, the low-swing signals 109 and 111, as well as full-swing signals 103 and 105, may be defined by a common mode 115 and a differential amplitude 117. The common-mode value 115 may be defined as the voltage range between ground 119 and a mid-amplitude value 121 of the signal. The differential amplitude value 117 may be defined as the voltage range between the mid-amplitude value 121 of the signal and a top amplitude value (Vmax) 123 of the signal.

Figure 2:
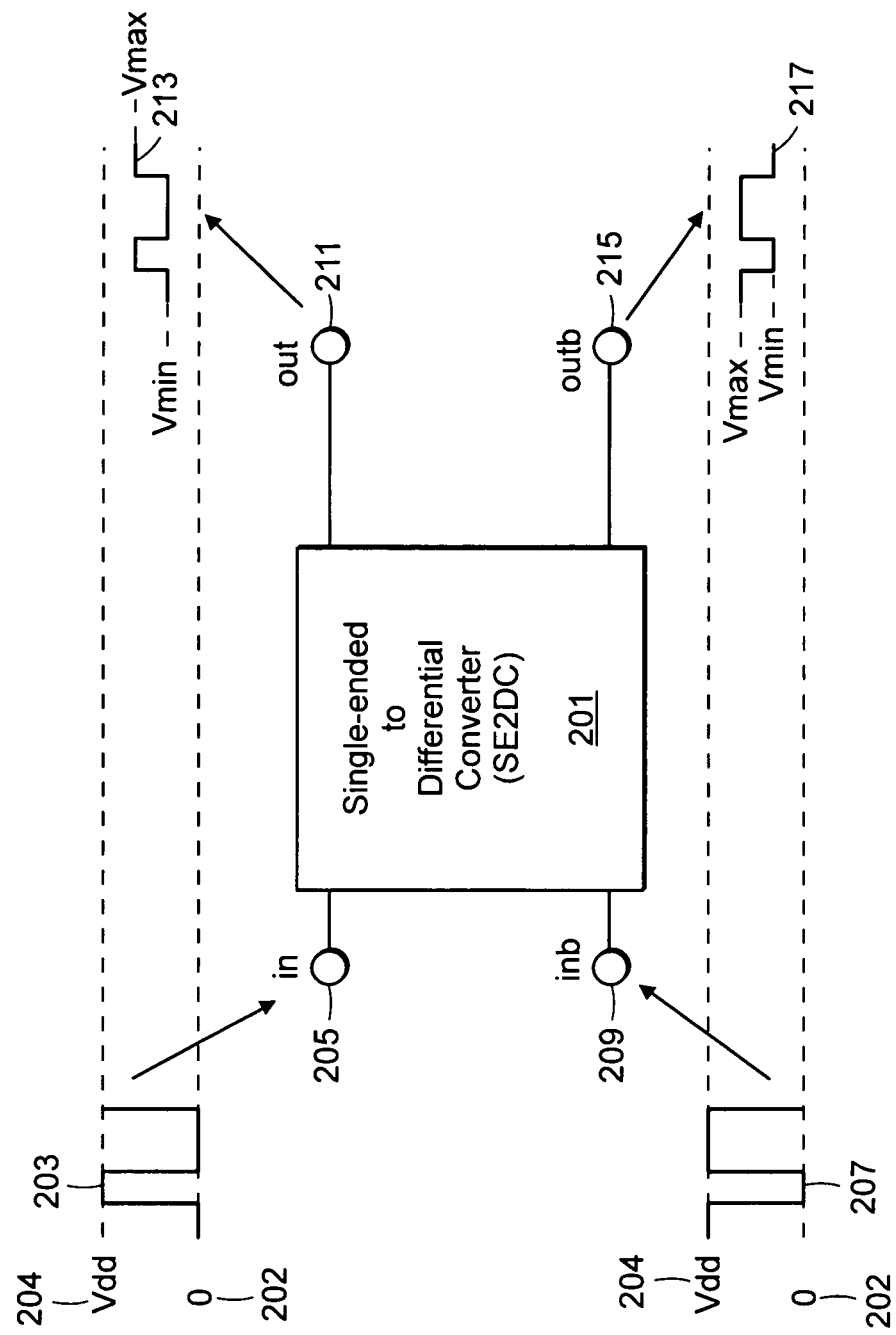
FIG. 2 illustrates an overview of the function of a single-ended to differential converter (SE2DC)

FIG. 2 illustrates an overview of a conversion function that may be provided by a single-ended to differential converter (SE2DC) circuit 201, namely, to translate the voltage levels at its input from full-swing single-ended values to a low-swing differential signal, with a pre-determined differential amplitude and common mode voltage. For example, a full-swing single-ended signal 203, spanning the entire voltage range from a low voltage supply rail, or ground (0V) 202 to the high voltage rail providing a source voltage value (Vdd) 204, may be input to a node 205 of the SE2DC 201. The corresponding inverse signal 207 of signal 203 may also be input to the SE2DC 201 through input node 209. Upon conversion, a node 211 of the SE2DC 201 may output a low-swing differential signal 213, ranging from voltage values Vmax and Vmin, whose waveform corresponds to the full-swing signal 203. Similarly, the SE2DC 201 may also output the corresponding inverted signal 217 via an output node 215.

It should be noted that prior art converter systems typically include various stages as well as a number of active circuit components. It may be highly desirable for power and area considerations to provide this conversion function using as few stages as possible. It may also be desirable to reduce the number of active circuit elements as they are prone to cause signal distortion. Thus, reducing the number of stages, in addition to the use of passive circuit elements, may aid in the prevention of distorting the differential signal as well as the reduction of overall system complexity. Furthermore, there is also a desire to finely tune the characteristics of the output signal.

Figure 3A:
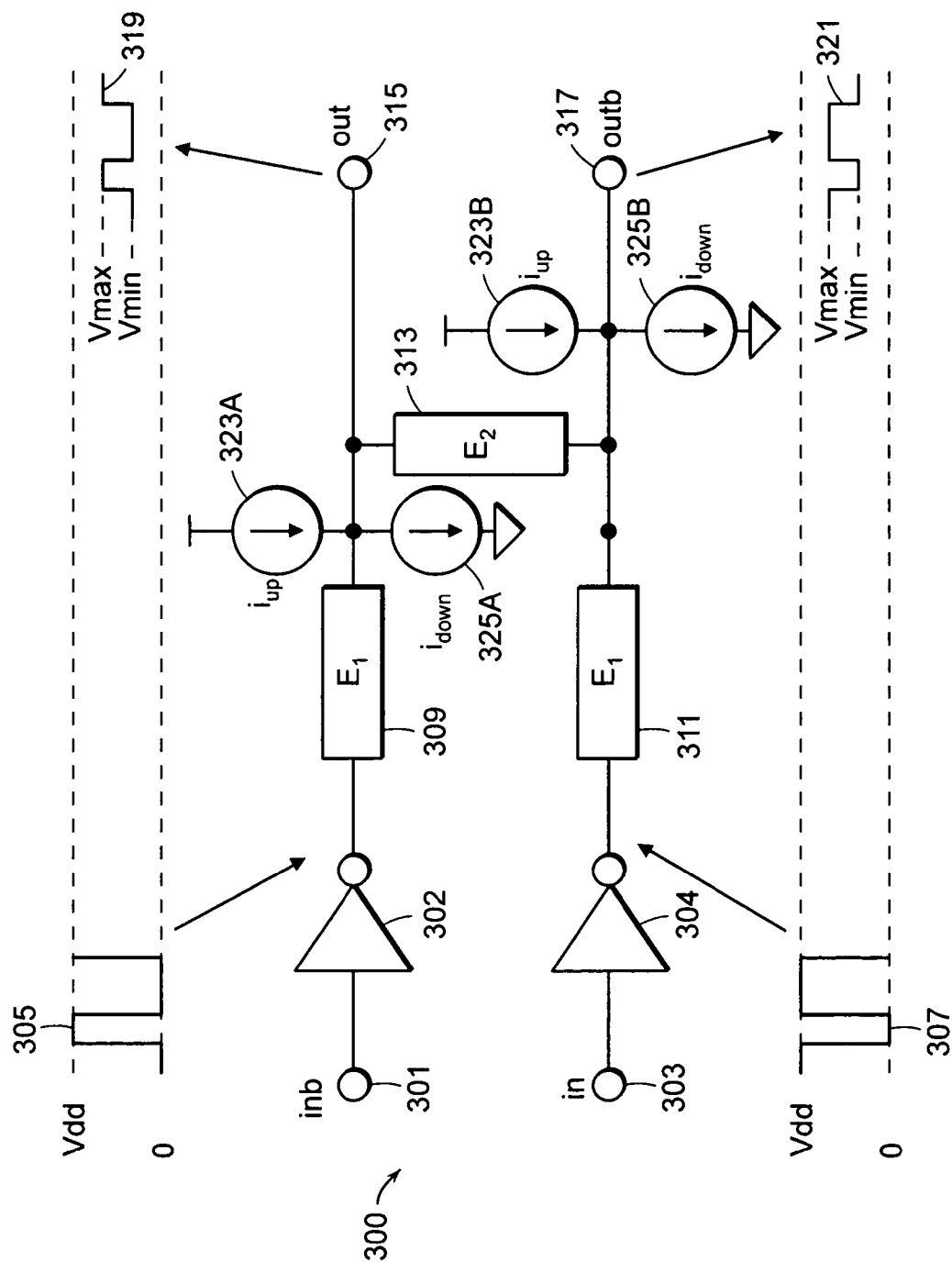
FIG. 3A is a schematic of a SE2DC according to example embodiments.

FIG. 3A illustrates an overview of the implementation of a SE2DC circuit 300 according to example embodiments. The SE2DC 300 may include input nodes 301 and 303 that may be configured to input full-swing single-ended signals 305 and 307, respectively. The input nodes 301 and 303 may be electrically connected to inverters 302 and 304, respectively. The signals 305 and 307 may be in the range of a high voltage value, Vdd (the value of the voltage source), and a low voltage value, ground (0V), where the signal 307 is the corresponding inverse signal of signal 305. The SE2DC circuit 300 may further include a pair of matched linear resistive elements $E_1$ 309 and 311 and a third linear resistive element $E_2$ 313. Additionally, the SE2DC circuit 300 may further include a pair of output nodes 315 and 317 configured to provide low-swing differential signals 319 and 321 respectively. The low-swing differential signals may be in the voltage range of Vmax to Vmin. The low-swing signal 321 may be the corresponding inverse signal of low-swing signal 319.

If ideal voltage sources (e.g., voltage sources including infinite drive strength) are assumed, which may drive full swing and complementary signals into input nodes 301 and 303, then the associated maximum and minimum voltage values (Vmax and Vmin, respectively) that may be provided by the output nodes out 315 and outb 317 (out and outb, respectively) may be represented by:

$$V\max(\text{out, out}b) = \frac{E_2 + E_1}{E_2 + 2E_1} Vdd \qquad (1)$$

$$V\min(\text{out, out}b) = \frac{E_1}{E_2 + 2E_1} Vdd. \qquad (2)$$

The linear resistive element $E_2$ may be a scaled version of $E_1$ described by a scaling factor defined as:

$$E_2 = \alpha E_1. \qquad (3)$$

The input resistance the circuit 300 may be provided by:

$$E\text{in}(\text{out, out}b) = (2+\alpha)E_1, \qquad (4)$$

and the output resistance of the output nodes out 315 and outb 317 may be given by:

$$E\text{out}(\text{out, out}b) = \frac{(1+\alpha)}{(2+\alpha)} E_1. \qquad (5)$$

Furthermore, by substituting the value of the resistive element $E_2$ of equation (3) and factoring the value of the resistive element $E_1$ out of equations (1) and (2), the maximum and minimum voltage values, Vmax and Vmin, of the output nodes out 315 and out b 317 may be reduced to:

$$V\max(\text{out, out}b) = \frac{1+\alpha}{2+\alpha} Vdd \qquad (6)$$

$$V\min(\text{out, out}b) = \frac{1}{2+\alpha} Vdd. \qquad (7)$$

The common mode voltage value of the output nodes, out 315 and outb 317 may therefore be described by:

$$V\text{cm\_out} = (V\max(\text{out, out}b) + V\min(\text{out, out}b))/2 = \frac{Vdd}{2}, \qquad (8)$$

and the output differential signal amplitude may be given by:

$$V\text{diff\_out} = (V\max(\text{out, out}b) - V\min(\text{out, out}b))/2 \qquad (9)$$

$$= \frac{\alpha}{2(2+\alpha)} Vdd.$$

Note that both output common mode and differential amplitude voltage values are determined solely by passive circuit elements. The output signal (Vmax and Vmin), the common mode (Vcm_out), and the differential amplitude (Vdiff_out) of equations (6)-(9) depend on the relative matching of resistive elements $E_1$ and $E_2$ (provided by the scaling factor $$\alpha = \frac{E_2}{E_1}.$$

Two key output design criteria for a SE2DC are typically signal output swing (Vmax and Vmin) and common mode voltage (Vcm_out). Because the differential stage receiving the output signal from the SE2DC may require specific values of a differential input swing and a common mode input level to operate properly, a desire may exist to precisely tune the characteristics of the SE2DC output signal. Furthermore, metal oxide semiconductor (MOS) differential amplifier stages, which are intended to receive the output SE2DC signal, typically require different common mode (Vcm_out) values depending on an intended operation. For example, a n-type metal oxide semiconductor (NMOS) input amplifier may often be designed to operate with inputs featuring common mode higher than $$\frac{Vdd}{2},$$

while a p-type metal oxide semiconductor (PMOS) input amplifier may be designed to operate with inputs featuring a common mode lower than $$\frac{Vdd}{2}.$$

In example embodiments, the maximum (Vmax) and minimum (Vmin) values of the SE2DC output signal, may be set by adjusting a resistive ratio value defined by $\alpha$. Furthermore, the common mode and differential amplitude voltage values may also be finely tuned by adjusting the ratio $\alpha$ between the resistive elements. It should be appreciated that the common mode may be adjusted independently via use of $\alpha$ and $I_{up}$ or $I_{down}$ as will be discussed shortly.

Figure 3B:
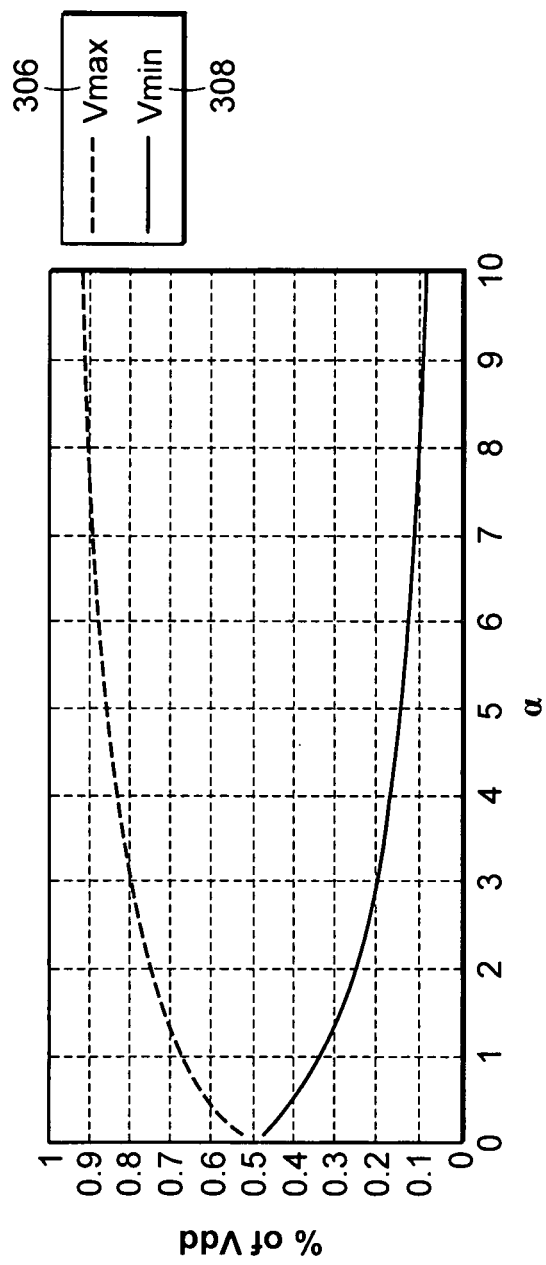
FIGS. 3B and 3C illustrate simulation results of the SE2DC of FIG. 3A.

FIG. 3B illustrates the possible modifications of Vmax 306 and Vmin 308 in terms of percentage values of Vdd (y-axis) in relation to adjustments made to the scaling factor $\alpha$ (x-axis). As described in Equation (6), as the resistive ratio $\alpha$ becomes sufficiently large, the value of Vmax is approximately equal to Vdd. Conversely, as described in Equation (7), as $\alpha$ becomes sufficiently large, the value of Vmin approaches zero.

Figure 3C:
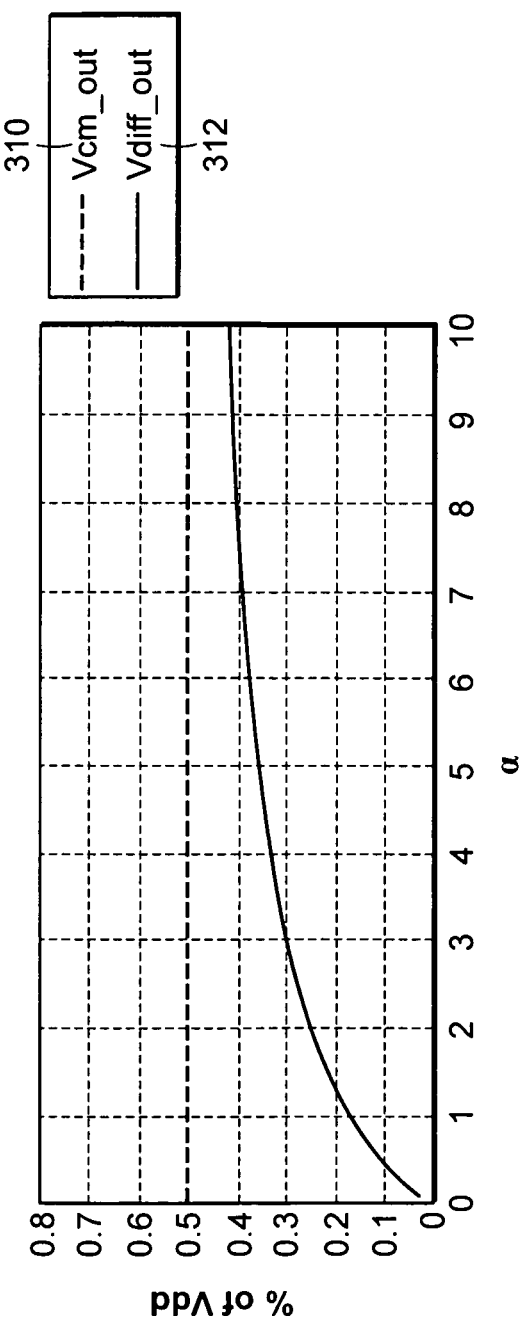

FIG. 3C illustrates the possible modifications of Vcm_out 310 and Vdiff_out 312 in terms of percentage values of Vdd (y-axis) in relation to adjustments made to the scaling factor $\alpha$ (x-axis). As expected from Equation (8), since the common mode voltage Vcm_out 310 of the output signal does not depend on the scaling factor $\alpha$, the command mode Vcm_out will remain constant with respect to changes in $\alpha$. However, as the scaling factor $\alpha$ increases the differential mode of the output signal Vdiff_out will increase to a maximum value of less than $$\frac{Vdd}{2},$$

as described in Equation (9).

The SE2DC circuit 300 may also include two pairs of input sources. The first pair of input sources 323A and 323B may be connected to the high voltage supply Vdd and may provide a current $I_{up}$. Adjustments of the current $I_{up}$ may increase the common mode voltage to a value greater than $$\frac{Vdd}{2} \left( e.g., Vcm\_out = \frac{Vdd}{2} + I_{up}E_1 \right).$$

The second pair of input sources 325A and 325B may be connected to ground (0V) and may provide a current $I_{down}$. Adjustments of the current $I_{down}$ may decrease the common mode voltage to a value less than $$\frac{Vdd}{2} \left( e.g., Vcm\_out = \frac{Vdd}{2} - I_{down}E_1 \right).$$

Figure 3D:
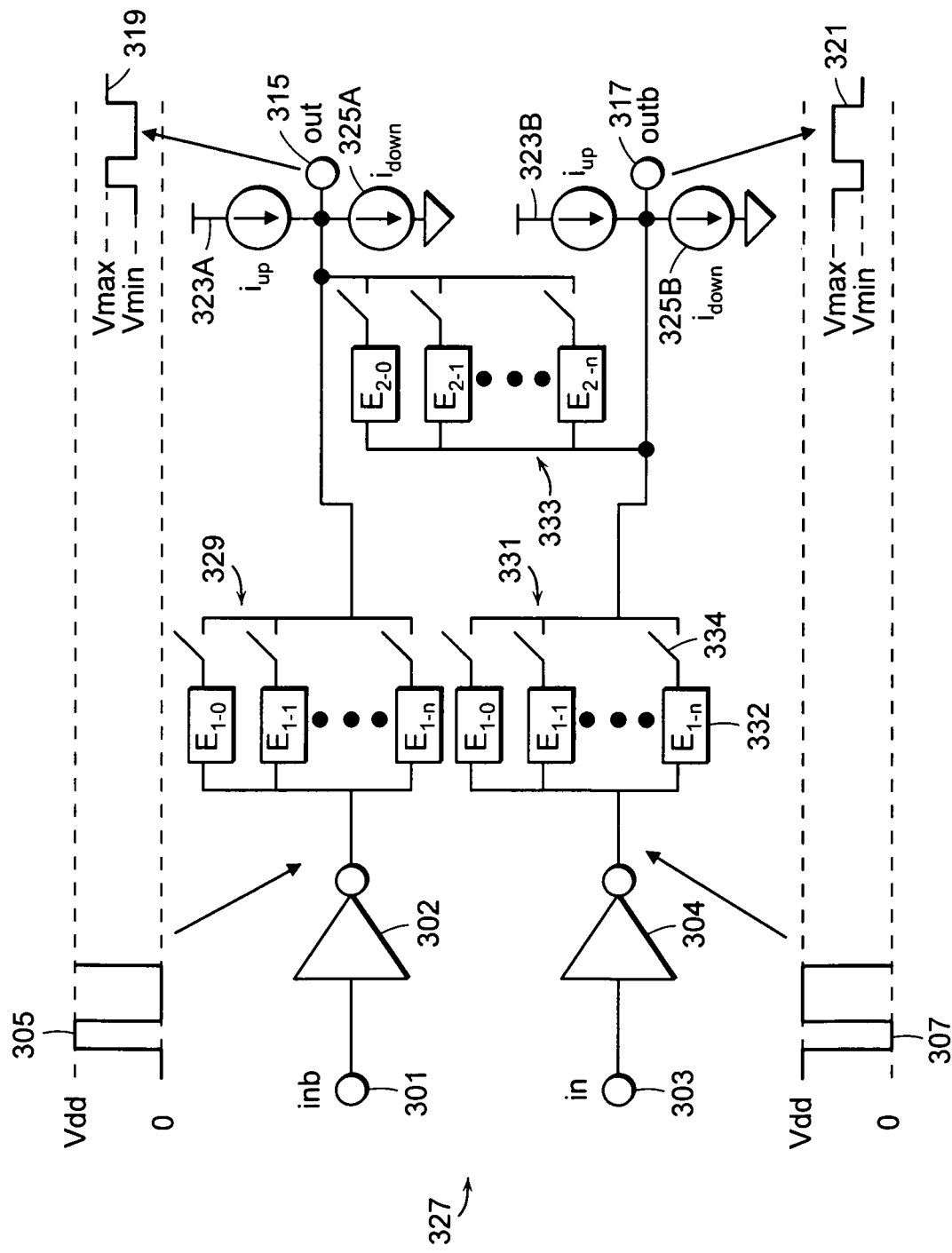
FIG. 3D illustrates a programmable SE2DC based on the SE2DC design illustrated in FIG. 3A according to example embodiments.

FIG. 3D illustrates an alternative SE2DC circuit design 327 of the SE2DC circuit 300 of FIG. 3A. The SE2DC circuit design 327 features all of the elements of the SE2DC circuit 300 of FIG. 3A with the exception of the linear resistive elements $E_1$ 309 and 311 and $E_2$ 313. The SE2DC design 327 instead may include linear programmable resistive elements that may be altered at anytime prior or during operation. Specifically, the matched linear resistive elements $E_1$ 309 and 311 may be replaced by a bank of programmable linear resistive elements 329 and 331, where each bank of programmable elements may include a number of linear resistive elements numbered $E_{1\_0}$-$E_{1\_N}$. The linear resistive element $E_2$ may be replaced by a similar bank of resistive elements 333 numbered $E_{2\_0}$-$E_{2\_N}$.

Note that each resistive element in the programmable bank includes a switching element connected serially to a respectively resistive element. For example, the resistive element 332 of bank 331 is serially connected to switch 334. If there is a desire to change the differential swing and/or common mode voltage during operation (e.g., on-the-fly adjustments), opening and closing the switches will modify the values of the overall resistance of the elements 329, 331, and 333, thereby providing the desired adjustment. A possible modification to the circuit 327 is replace the switching elements with MOS switches (e.g., MOS devices operating as small resistors when "on" and open circuits when "off").

Figure 4A:
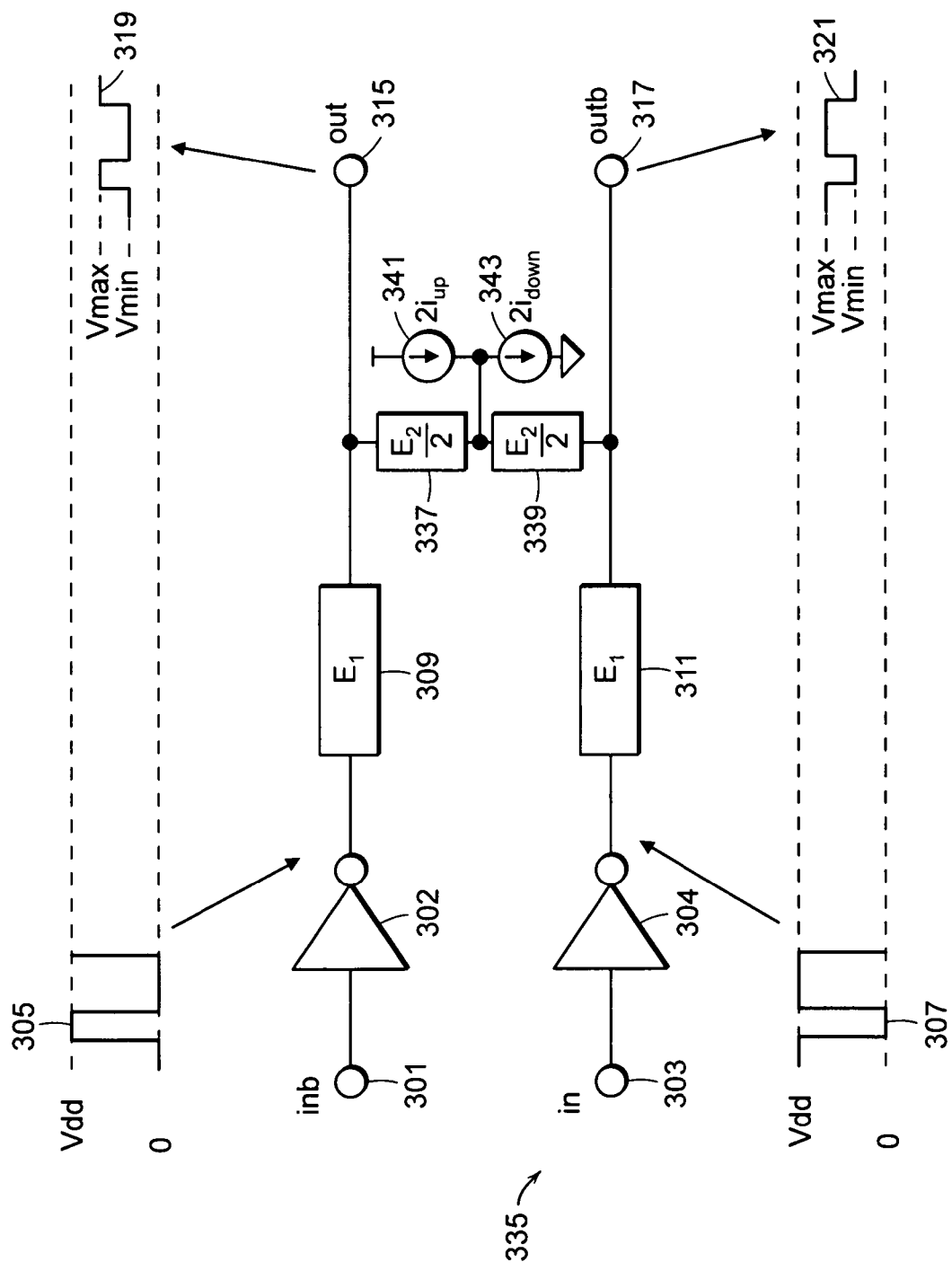
FIG. 4A is a schematic of another SE2DC according to example embodiments.

FIG. 4A illustrates yet another alternative SE2DC design 335 of the SE2DC circuit 300 of FIG. 3A. The SE2DC design 335 of FIG. 4A includes all of the elements of the SE2DC circuit 300 of FIG. 3A with the exception that the linear resistive element $E_2$ 313 is replaced with two linear resistive elements $$\frac{E_2}{2} \ 337$$

and 339 in parallel. Additionally, the first pair of current sources 323A and 323B of FIG. 3A is replaced by a single current source 341 providing a current $2I_{up}$, which may be used to increase the common mode voltage to a value greater than $$\frac{Vdd}{2} \left( e.g., Vcm\_out = \frac{Vdd}{2} + I_{up}E_1 \right).$$

The second pair of current sources 325A and 325B is also replaced by a single current source 343 providing a current $2I_{down}$, which may be used to decrease the common mode voltage to a value less than $$\frac{Vdd}{2} \left( \text{e.g., Vcm\_out} = \frac{Vdd}{2} - I_{down}E_1 \right).$$

Figure 4B:
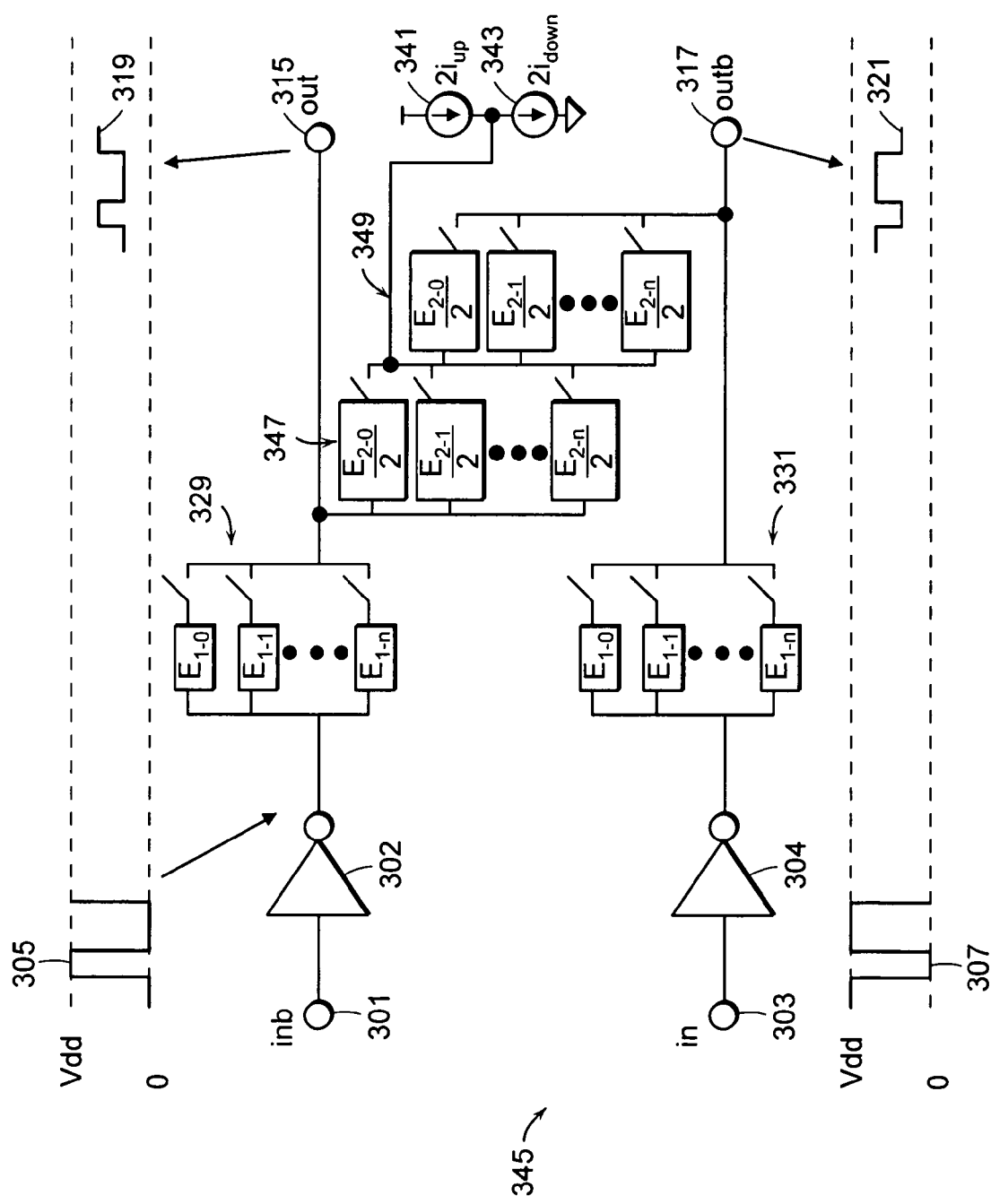
FIG. 4B is a schematic of a programmable SE2DC based on the SE2DC design illustrated in FIG. 4A according to example embodiments.

FIG. 4B illustrates an alternative SE2DC design 345 of the SE2DC circuit 335 of FIG. 4A. The SE2DC design of FIG. 4B includes all of the elements of the SE2DC circuit 335 of FIG. 4A with the exception that the matched linear resistive elements $E_1$ 309 and 311 of FIG. 4A is replaced with the matched programmable resistive bank 329 and 331 featuring linear resistive elements numbered $E_{1\_0}$-$E_{1\_N}$. Similarly, the parallel linear resistive elements 337 and 339 may also be replaced by two parallel banks of resistive elements 347 and 349 featuring elements numbered $$\frac{E_{2\_0} - E_{2\_N}}{2}.$$

By adjusting the resistive values, the differential mode may be altered.

It should be appreciated that the linear resistive elements $E_1$ and $E_2$ may be in the form of any known circuit element capable of providing a resistance, for example a resistor or a metal oxide semiconductor field effect transistor (MOSFET). Regardless of whether the resistive elements are MOS based or resistor based, there are well known current generation techniques (e.g., replica biasing) in the art to create accurate currents $I_{up}$ or $I_{down}$ that are largely process, voltage, and temperature immune. The current generation may also be able to track varying conditions in the resistive elements. Furthermore, these well know techniques may use replicas of the resistive elements and drop a stable and known voltage across the elements. Variations in the resistive elements are therefore tracked over varying environmental conditions.

It should also be appreciated that the output common mode of the SE2DC may be tailored to fit the desired value for driving the differential stage to follow by changing the magnitude and polarity of the current ($I_{up}$ or $I_{down}$) used to set the common mode voltage. The flexibility afforded by this approach lends itself for use in feedback circuits that may be used to optimize the common mode output of a differential stage that drives another differential stage. This can be accomplished by using variable current sources.

It should further be appreciated that the implementations of the current sources employed in altering the common mode voltage Vcm_out may minimally change the output and input resistance of the SE2DC as described in Equations (4) and (5). However, the differential output swing may remain unaffected by the addition of the current sources.

Figure 5B:
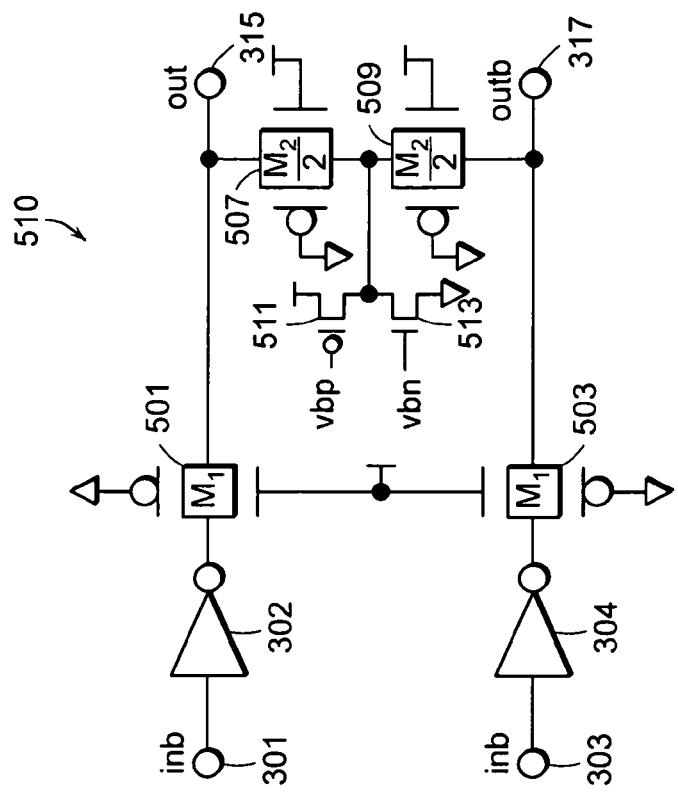
FIGS. 5A and 5B are schematics of a SE2DC featuring a resistive network of MOS devices according to example embodiments.
Figure 5A:
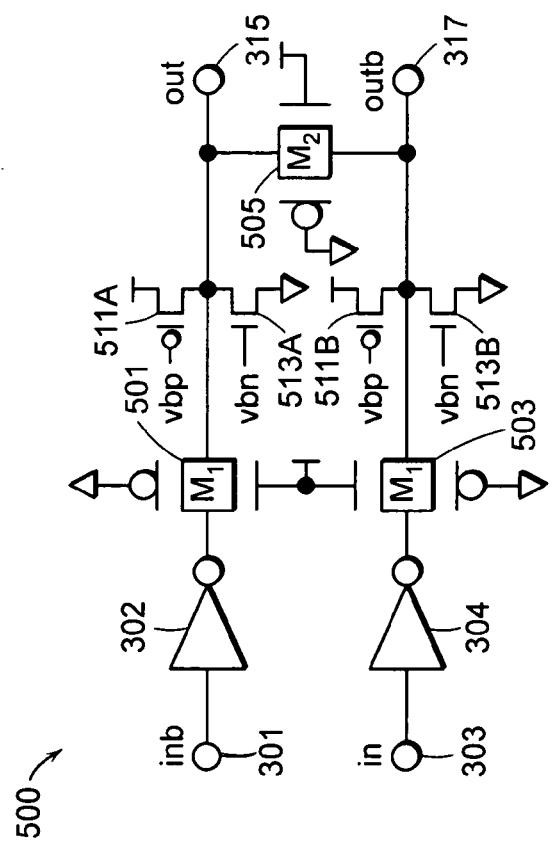

FIG. 5A illustrates a SE2DC circuit design 500 similar to the SE2DC design 300 of FIG. 3A where the linear resistive elements $E_1$ and $E_2$ are replaced with PMOS elements $M_1$ 501 and 503, and $M_2$ 505. The resistive PMOS elements $M_1$ 501 and 503, and $M_2$ 505 are configured to operate in their respective linear regions (e.g., the drain to source voltages of the PMOS elements $M_1$ and $M_2$ are less than their respective gate voltage minus a threshold voltage). A PMOS operating in the linear region is the functional equivalent of a resistor. Thus, in the linear region, a PMOS is a passive device. While operating in the linear region, the current provided by a MOS device may be expressed by:

$$I_{ds} = \mu_{cox} \frac{W}{L} \left( V_{gs} - V_{th} - \frac{V_{ds}}{2} \right) \frac{V_{ds}}{2} \tag{10}$$

where $I_{ds}$ is the current emitted from the drain to source terminals of the MOS device, W is the channel width, L is the channel length, $V_{gs}$ is the voltage applied to the gate terminal, $V_{ds}$ represents the voltage across the drain and source terminals, and $V_{th}$ is the threshold voltage associated with a particular MOS device. The MOS current $I_{ds}$ is also dependent on a coefficient $\mu_{cox}$ which is a function of the mobility of carriers in the MOS channel, the dielectric constant of the gate oxide, and the thickness of the oxide. Assuming that $$V_{gs} - V_{th} \gg \frac{V_{ds}}{2},$$

Equation (10) may be reduced to:

$$I_{ds} \approx \mu_{cox} \frac{W}{L} (V_{gs} - V_{th}) \frac{V_{ds}}{2}. \tag{11}$$

As previously mentioned, when operating in the linear region (e.g., $V_{ds} < V_{gs} - V_{th}$), the MOS device may function as a resistor. The value of the MOS resistance may be provided by:

$$R_{ds} \approx \frac{2}{\mu_{cox} \frac{W}{L} (V_{gs} - V_{th})}. \tag{12}$$

Utilizing the MOS resistor definition provided above, the maximum, minimum, common mode, and differential mode of the output signal may be found using Equations (6)-(9), respectively.

The first pair of current sources 323A-323B, as illustrated in FIG. 3A, may also be replaced with PMOS elements in the converter of FIG. 5A, while the second pair of current sources 325A-325B may be replaced with NMOS elements. If it is desired to modulate the common mode voltage to a value greater than $$\frac{Vdd}{2} \left( \text{e.g., Vcm\_out} = \frac{Vdd}{2} + I_{up}E_1 \right)$$

the first current source pair of PMOS elements 511A and 511B may be used. If it is desired to modulate the common mode voltage to a value less than $$\frac{Vdd}{2} \left( \text{e.g., Vcm\_out} = \frac{Vdd}{2} - I_{down}E_1 \right),$$

the second source pair of NMOS elements 513A and 513B may be used. The amount of modulation in the common mode voltage introduced via the first and second current source pair may be adjusted by controlling the voltages Vbp and Vbn that are supplied to the gates of the first and second current source pair elements, respectively.

An on-the-fly implementation of the circuit shown in FIG. 5A may be provided by using a bank of PMOS devices in the place of PMOS elements $M_1$ and $M_2$, as described in FIG. 3B. The gate of each PMOS device in the bank may be individually controlled in order to place the respective device in an off or on state. Furthermore, by modulating the voltage supplied to the gate of each PMOS device, the value of the current provided by each individual device may be controlled. Having control of the individual devices allows for precise tuning of the bank. Thus, the bank of PMOS devices will not require the use of a switch connected in series with the device (e.g., switch 334).

FIG. 5B illustrates a SE2DC circuit design 510 similar to the SE2DC design 327 of FIG. 3B where the linear resistive elements $E_1$ and $$\frac{E_2}{2}$$

are also replaced with PMOS elements $M_1$ 501 and 503, and $$\frac{M_2}{2}$$

507 and 509, respectively. The resistive PMOS elements $M_1$ 501 and 503, and $$\frac{M_2}{2}$$

507 and 509 are also configured to operate in their respective linear regions (e.g., $V_{ds} < V_{gs} - V_{th}$). Thus, PMOS devices $M_1$ and $$\frac{M_2}{2}$$

are passive devices.

Figures 6A, 6B:
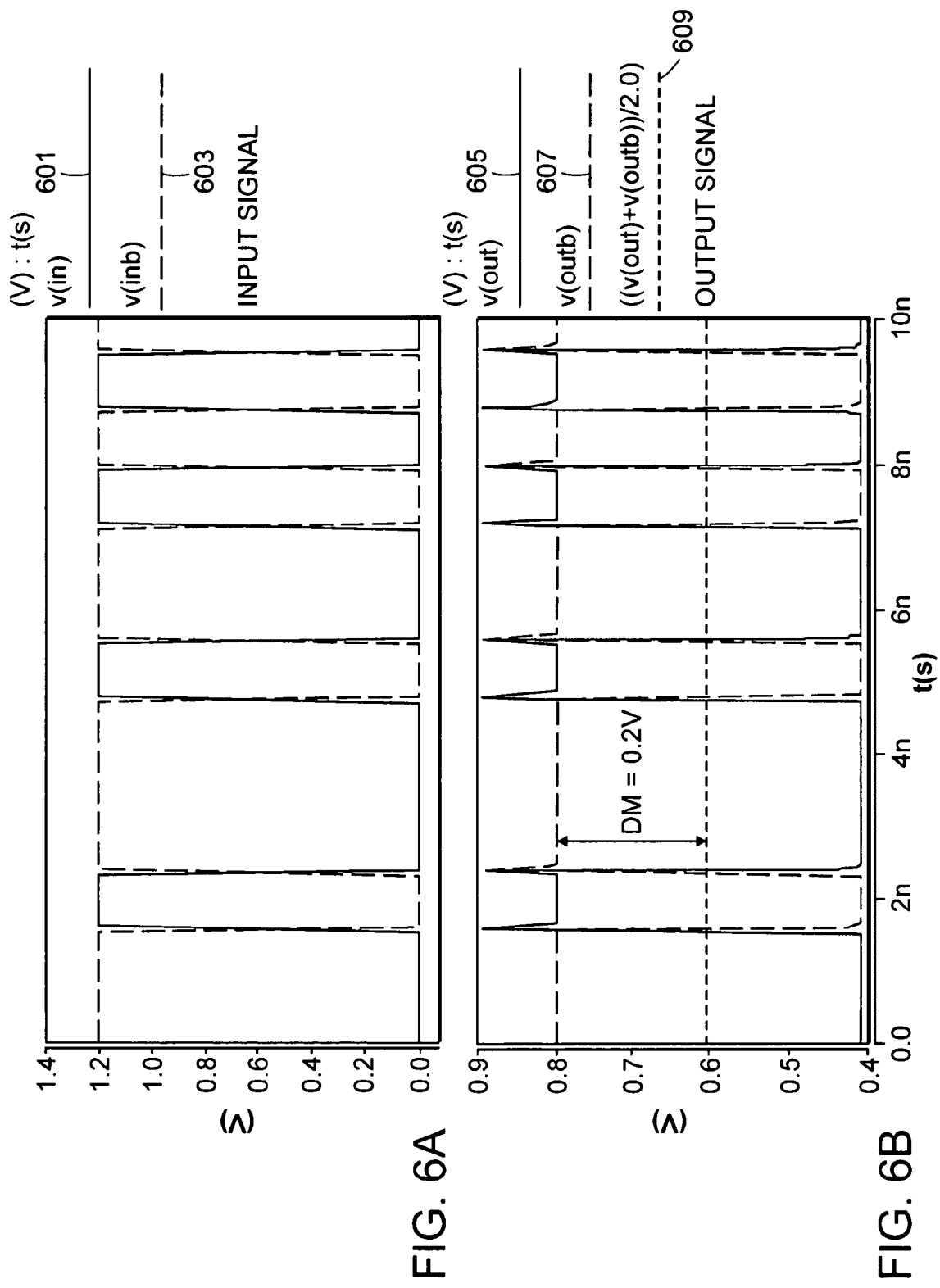
FIGS. 6A and 6B illustrate simulation results obtained using the SE2DC design of FIG. 5A or 5B.

FIGS. 6A and 6B illustrate an example of an input signal and an output signal, respectively, that may be obtained using the SE2DC circuits of FIG. 5A or 5B. Both the input and output signals of FIGS. 6A and 6B, respectively, are graphically depicted in terms of voltage (y-axis) and time (x-axis). The single-ended input signals include two inverse components V(in) 601 and V(inb) 603 having a single-ended swings ranging from 0V (ground) to 1.2V (Vdd). The resulting differential output signal also includes two inverse components V(out) 605 and V(outb) 607 having a differential swing ranging from 0.4V (Vmin) to 0.8V (Vmax). The common mode voltage 609 is also plotted in FIG. 6B. Note that the common mode voltage 609 is approximately 0.6V which is equal to half of the source voltage Vdd. The differential mode voltage (DM) has a value of 0.2V. The common mode and differential mode voltage values are expected as described in Equations (8) and (9), thus adjustments to current sources or resistive ratios have not been applied to modify the output signal. Also note that the scaling factor α is equal to 1 since the resistive elements are matched.

Figure 7:
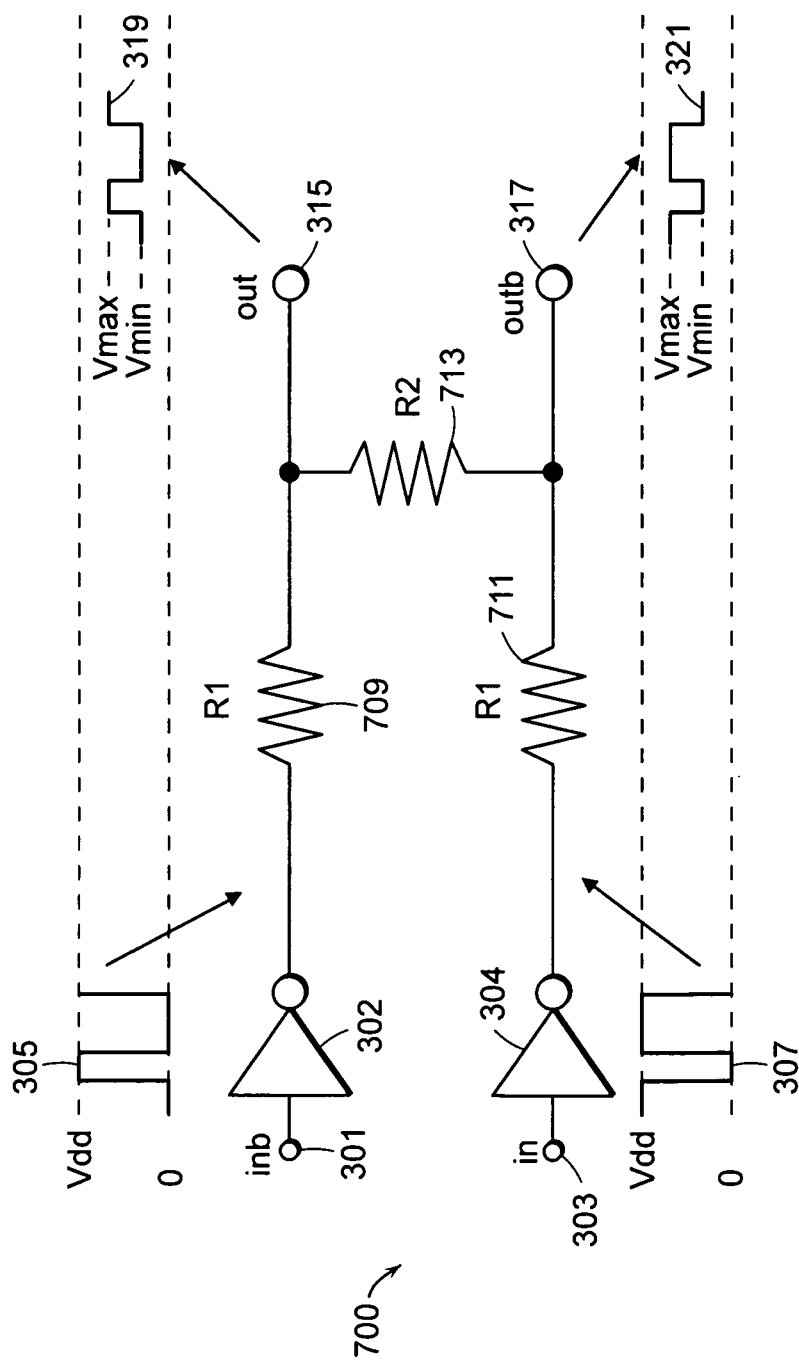
FIG. 7 is a schematic of a SE2DC featuring a resistive network including resistors according to example embodiments.

FIG. 7 illustrates a SE2DC circuit design 700 similar to the SE2DC design 300 of FIG. 3A where the linear resistive elements $E_1$ and $E_2$ are replaced with resistors $R_1$ 709 and 711, and $R_2$ 713. The operation of the fully passive SE2DC circuit 700 may also be described by Equations (6)-(9). It should be noted that while absolute values of on-chip resistors are typically only specified to be within a +/−20% deviation of a nominal value, matching between resistors is typically better than 1%. Therefore, both the common mode voltage Vcm_out and differential voltage Vdiff_out may be precisely tuned by adjusting the scaling factor α.

Figure 8A:
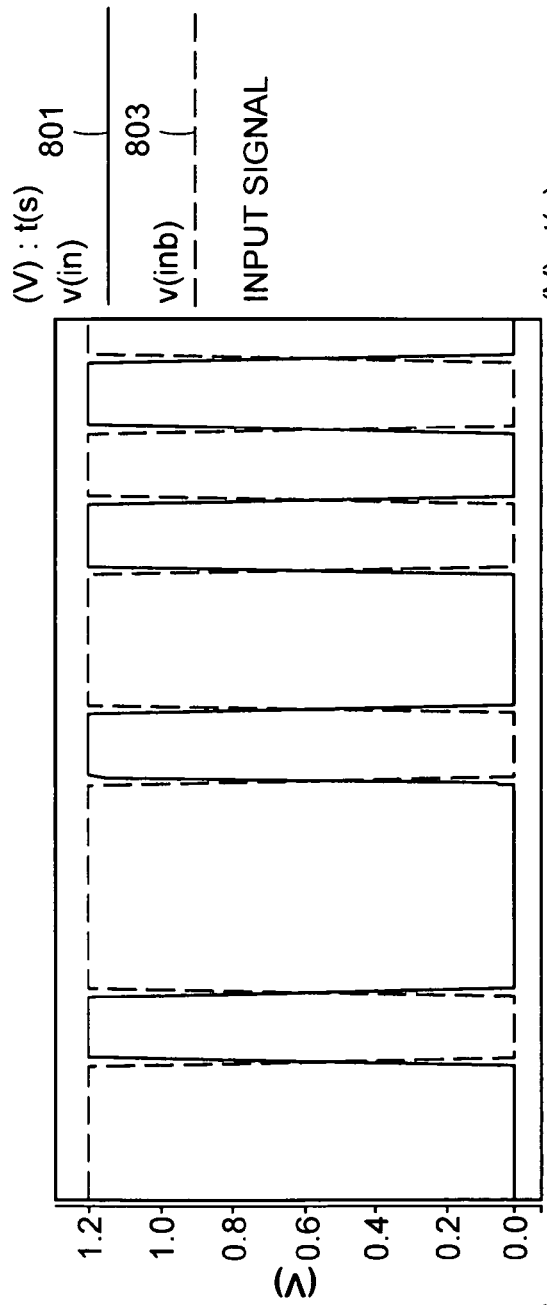
FIGS. 8A and 8B illustrate simulation results of the SE2DC of FIG. 7.
Figure 8B:
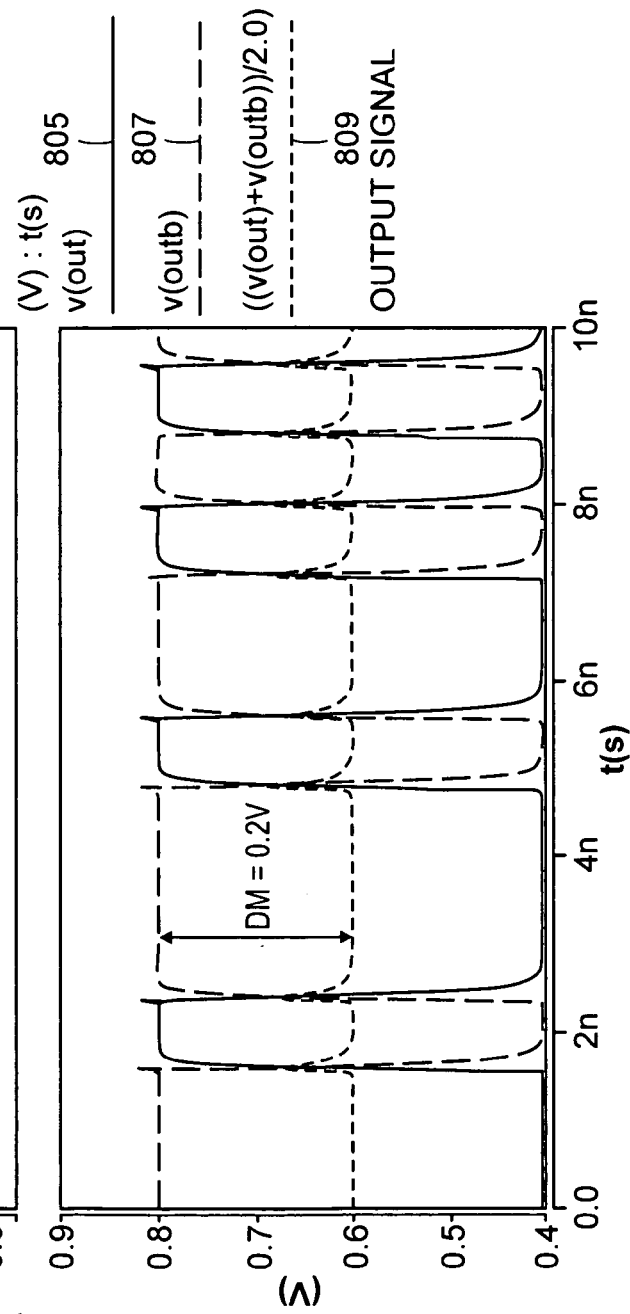

FIGS. 8A and 8B illustrate an example of an input signal and an output signal, respectively, that may be obtained using the SE2DC circuit of FIG. 7. Both the input and output signals of FIGS. 8A and 8B, respectively, are graphically depicted in terms of voltage (y-axis) and time (x-axis). Similarly to the example provided in FIGS. 6A and 6B, the single-ended input signal includes two inverse components V(in) 801 and V(inb) 803 having a single-ended swing ranging from 0V (ground) to 1.2V (Vdd). The resulting differential output signal also includes two inverse components V(out) 805 and V(outb) 807 having a differential swing ranging from 0.4V (Vmin) to 0.8V (Vmax). The common mode voltage 809 is also plotted in FIG. 8B and is approximately 0.6V which is equal to half of the source voltage Vdd. The differential mode voltage (DM) has a value of 0.2V. Thus, the example of FIG. 8B illustrates that the resistor embodiment of FIG. 7 and the MOS embodiment of FIGS. 5A and 5B may provide similar results. Note that the results of FIG. 8B are provided with the scaling factor being set to α=1, therefore the values of $R_1=R_2$. The values of the common mode voltage Vcm_out and the differential Vdiff_out are the expected results according to equations (6)-(9).

FIGS. 9A-9D illustrate resistor embodiments of the circuits illustrated in FIGS. 3A and 4A. In the SE2DC resistor circuit of FIG. 9A, the current source pair of current sources 323A and 323B may be used to raise the common mode voltage Vcm_out to a value greater than $$\frac{Vdd}{2}$$

by an amount $I_{up}E_1$. The SE2DC resistor circuit of FIG. 9C may also be used to raise the common mode voltage Vcm_out by an amount $I_{up}E_1$ with the use of a single current source 323 and by replacing the single resistor $R_2$ 713 with two resistors $$\frac{R_2}{2}$$

737 and 739. The SE2DC resistor circuit illustrated in FIG. 9B includes a current source pair of current 325A and 325B that may be used to decrease the common mode voltage Vcm_out to a value less than $$\frac{Vdd}{2}$$

by an amount $I_{down}E_1$. The SE2DC resistor circuit of FIG. 9D may also be used to lower the common mode voltage Vcm_out by an amount $I_{down}E_1$ with the use of a single current source 325 and also by replacing the single resistor $R_2$ 713 with two resistors $$\frac{R_2}{2}$$

737 and 739.

Figure 10:
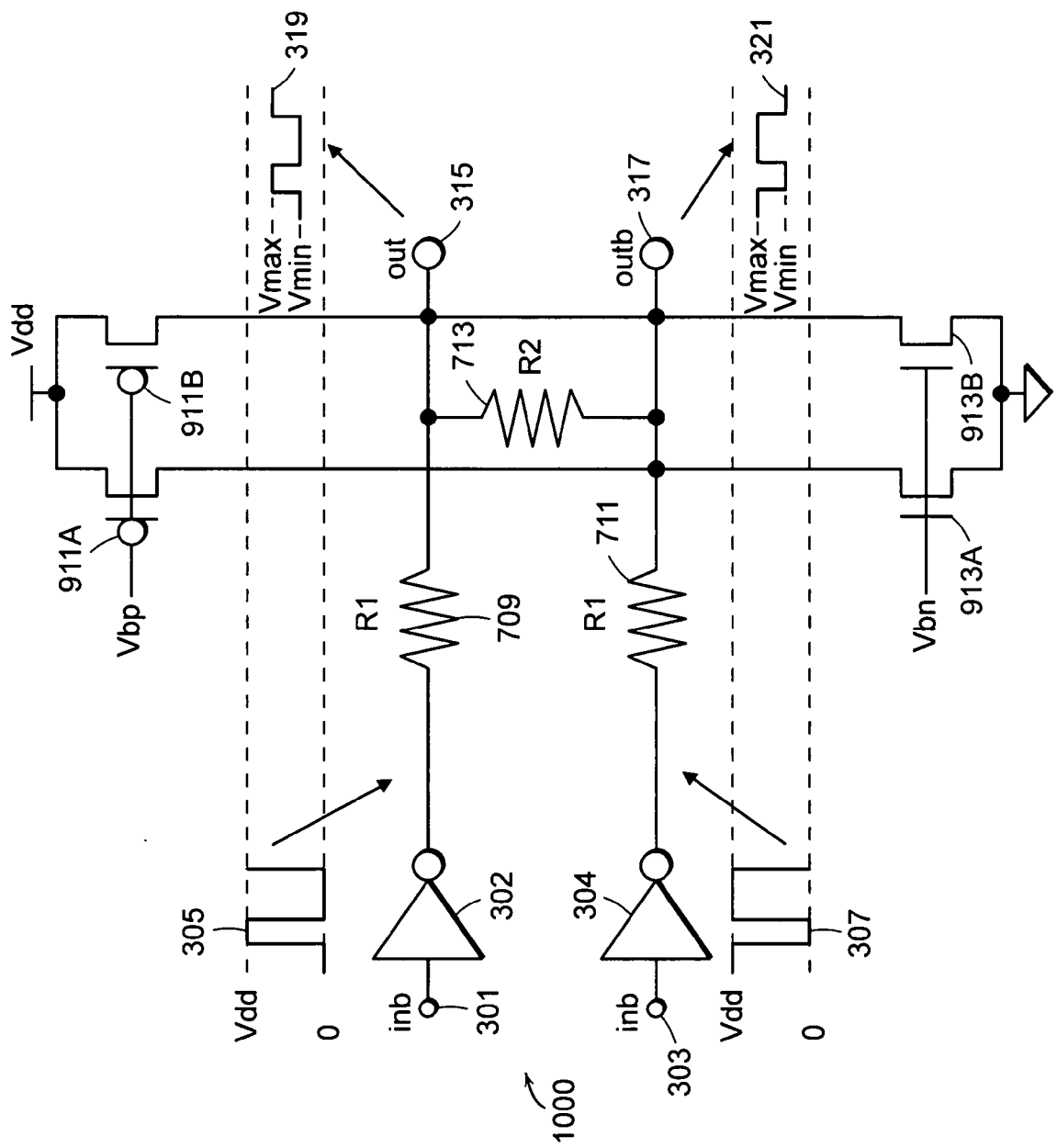

FIG. 10 illustrates the SE2DC circuit design of FIG. 3A featuring linear resister elements $R_1$ 709 and 711, and $R_2$ 713. The circuit 1000 illustrated in FIG. 10 also features a first and second current source pair 911A-911B and 913A-913B including PMOS and NMOS transistors, respectively. The first current source pair 911A and 911B may be used to increase the common mode voltage of the output signal Vcm_out by and amount $I_{up}E_1$. The second current source pair 913A and 913B may be used to decrease the common mode voltage of the output signal Vcm_out by an amount $I_{down}E_1$.

Figure 9B:
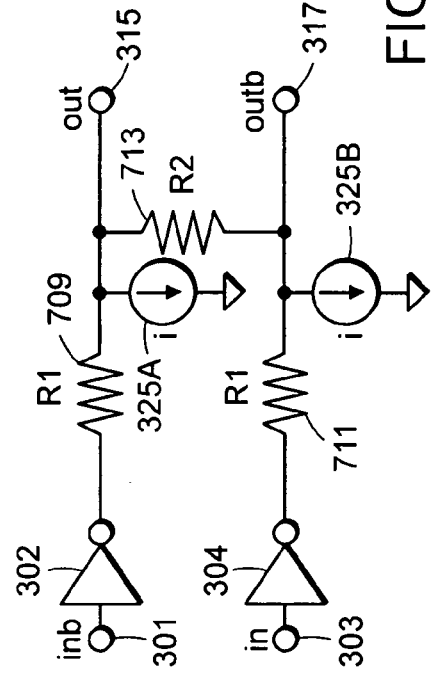
FIGS. 9A-9D and 10 are schematics of alternative designs of the SE2DC of FIG. 7 further including variable current sources connected to the resistive network according to example embodiments.
Figure 9A:
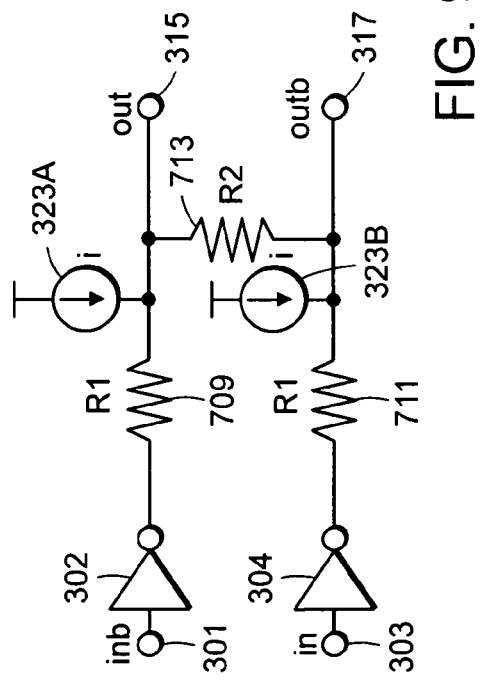
Figure 9D:
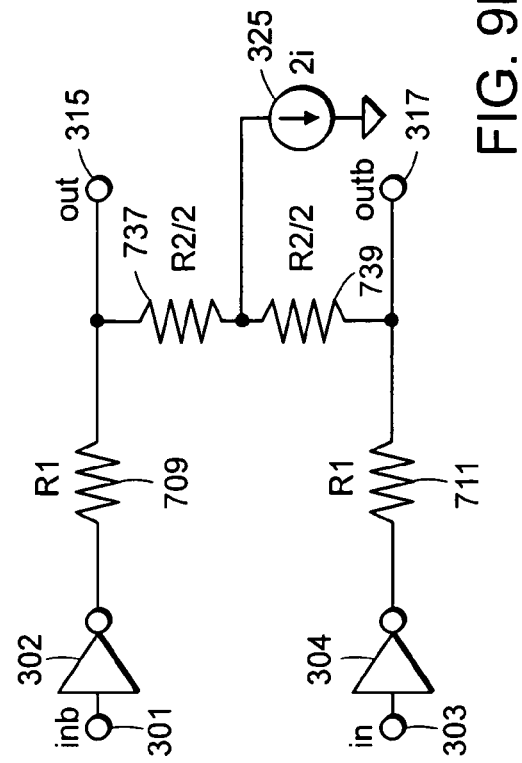
Figure 9C:
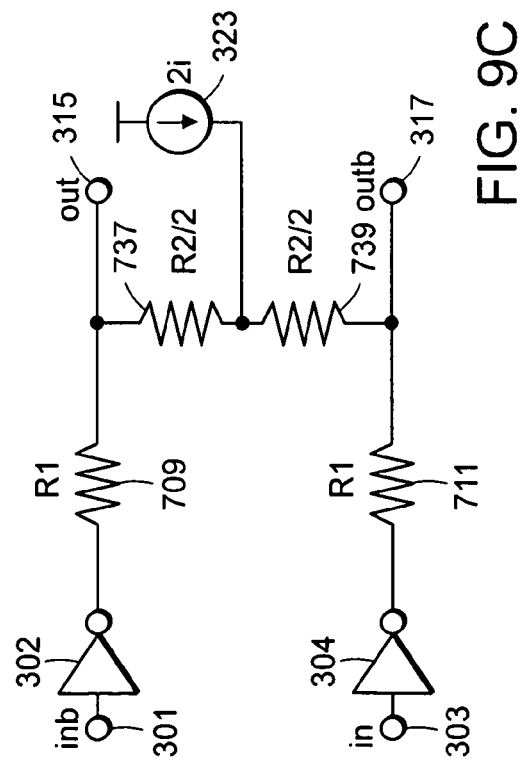
Figure 11A:
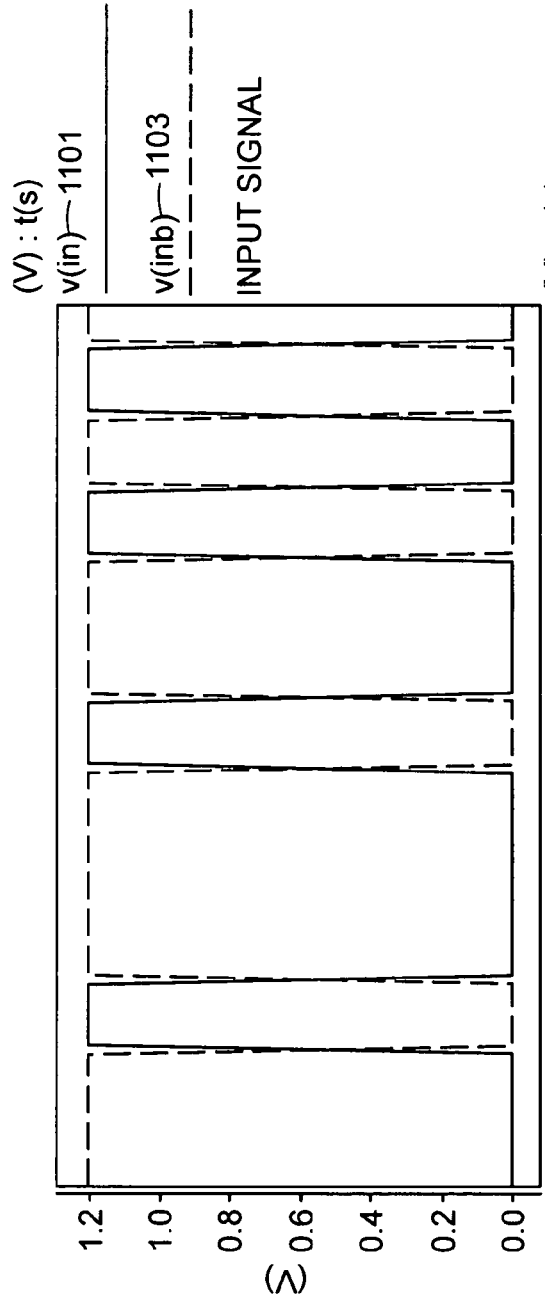
FIGS. 11A and 11B illustrate simulation results of the SE2DC of FIG. 9A, 9C, or 10.
Figure 11B:
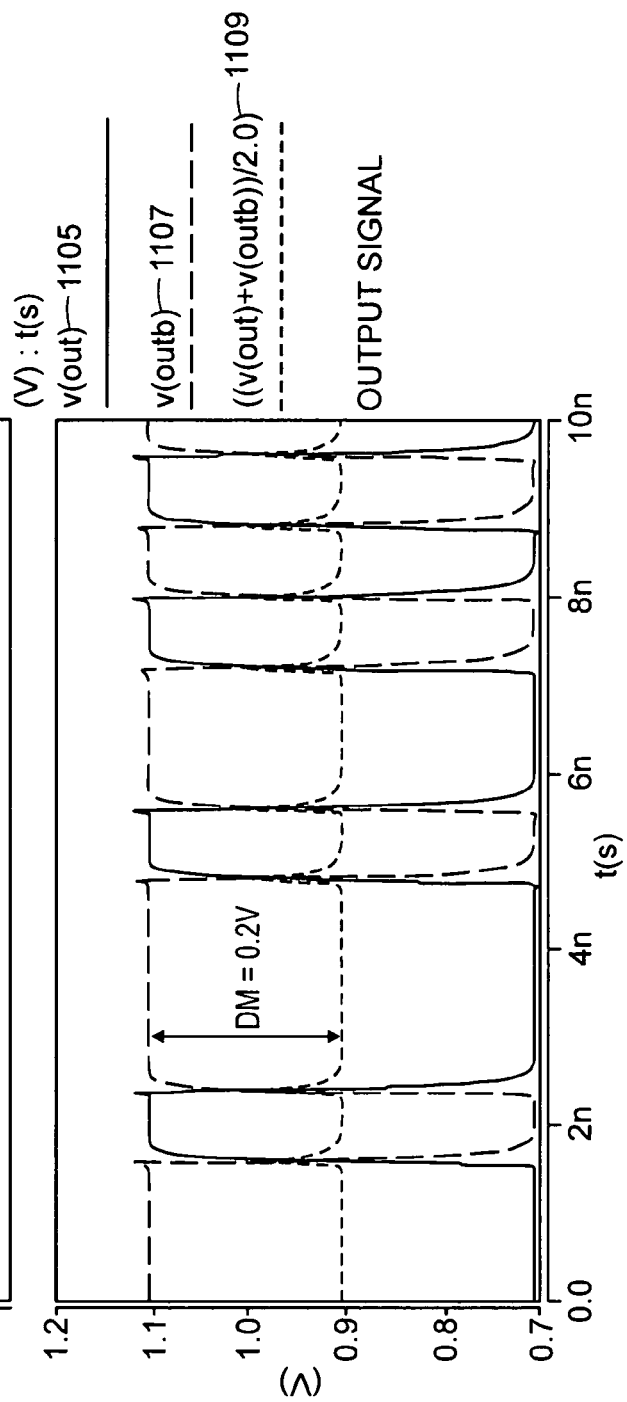

FIGS. 11A and 11B illustrate an example of an input signal and an output signal, respectively, that may be obtained using the SE2DC circuit of FIG. 9A, 9C or 10. Both the input and output signals of FIGS. 11A and 11B, respectively, are graphically depicted in terms of voltage (y-axis) and time (x-axis). The single-ended input signal includes two inverse components V(in) 1101 and V(inb) 1103 having a single-ended swing ranging from 0V (ground) to 1.2V (Vdd). The resulting differential output signal, described by equations (6)-(9), also includes two inverse components V(out) 1105 and V(outb) 1107 having a differential swing ranging from 0.7V (Vmin) to 1.1V (Vmax). The common mode voltage 1109 is also plotted in FIG. 11B and is approximately 0.9V which is greater than half of the source voltage Vdd. Thus, in order to obtain the output signal illustrated in FIG. 11B, a current source may have been utilized to shift the common mode voltage without changing the differential mode voltage. The differential mode voltage (DM) has a value of 0.2V. Note that the results of FIG. 11B are provided with the scaling factor being set to $\alpha=1$, therefore the values of $R_1=R_2$.

FIGS. 12A and 12B illustrate an example of an input signal and an output signal, respectively, that may be obtained using the SE2DC circuit of FIG. 9B, 9D or 10. Both the input and output signals of FIGS. 12A and 12B, respectively, are graphically depicted in terms of voltage (y-axis) and time (x-axis). The single-ended input signal includes two inverse components V(in) 1201 and V(inb) 1203 having a single-ended swing ranging from 0V (ground) to 1.2V (Vdd). The resulting differential output signal, described by equations (6)-(9), also includes two inverse components V(out) 1205 and V(outb) 1207 having a differential swing ranging from 0.1V (Vmin) to 0.5V (Vmax). The common mode voltage 1209 is also plotted in FIG. 12B and is approximately 0.3V which is less than half of the source voltage Vdd. Thus, in order to obtain the output signal illustrated in FIG. 12B, a current source was utilized to shift the common mode voltage, without changing the differential mode voltage. The differential mode voltage (DM) has a value of 0.2V. Note that the results of FIG. 12B are also provided with the scaling factor being set to $\alpha=1$, therefore the values of $R_1=R_2$.

Figures 13A, 13B:
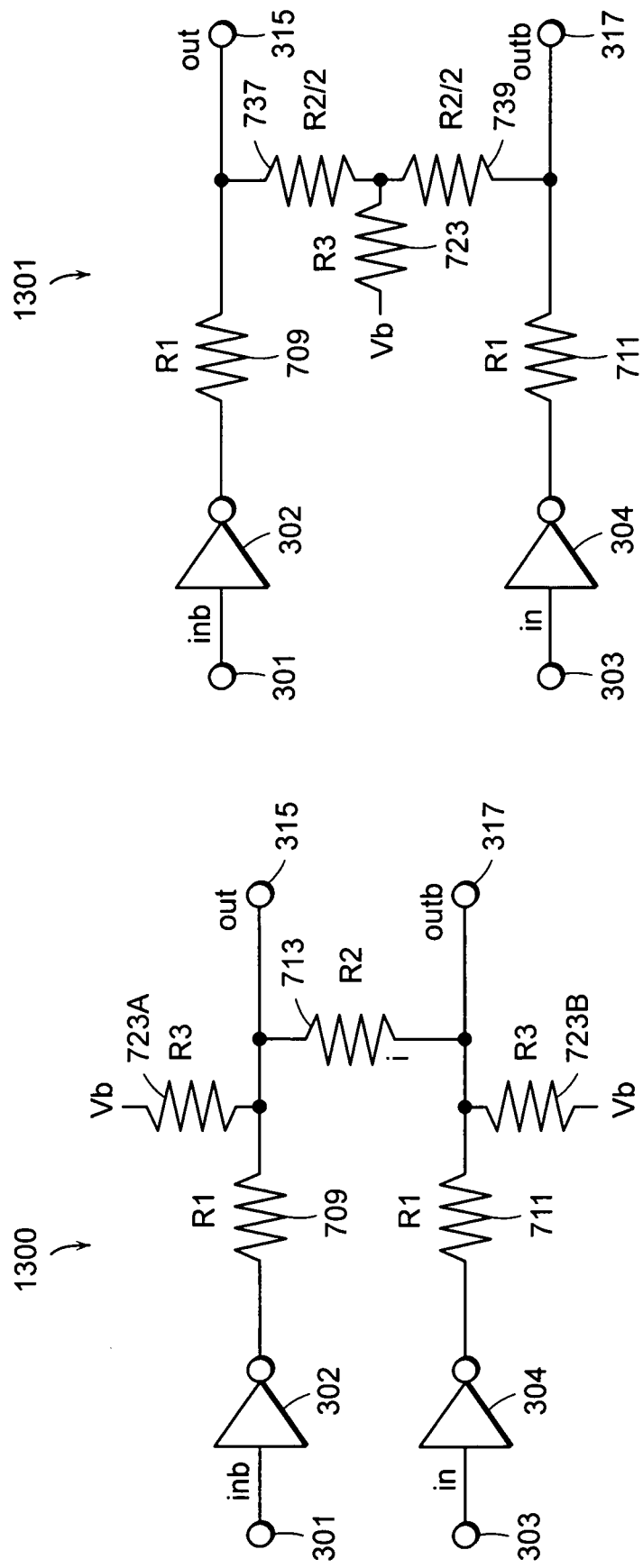
FIGS. 13A and 13B are schematics of alternative SE2DC designs featuring resistive elements in place of the variable current sources according to example embodiments.

FIGS. 13A and 13B illustrate a fully resistive SE2DC system according to example embodiments. The fully resistive SE2DC circuit 1300 of FIG. 13A is similar in design to the SE2DC circuits of FIGS. 9A and 9B with the exception that the current sources 323A-323B and 325A-325B have been replaced with two resistors $R_3$ 723A-723B. Depending on the value of the input resistor voltage Vb, the resistors $R_3$ 723A-723B may provide a current that may be used to either lower, increase, or stabilize the common mode voltage Vcm_out in a similar manner as described in FIGS. 9A and 9B.

FIG. 13B illustrates a fully resistive SE2DC circuit 1301 that is similar in design to the SE2DC circuits of FIGS. 9C and 9D with the exception that the current sources 323 and 325 have been replaced with a single resistor $R_3$ 723. Similarly to the circuit design illustrated in FIG. 13A, the value of the input resistor voltage Vb may be used to provide a current that may either lower, increase, or stabilize the common mode voltage Vcm_out in a similar manner as described in FIGS. 9C and 9D.

The presence of the additional resistor $R_3$ may alter output swing, differential mode, and common mode of the low-swing differential output signal. The maximum voltage value of the output swing Vmax may be provided by:

$$V\text{max}(out, outb) = \frac{R_3||[R_2+(R_1||R_3)]}{R_3||[R_2+(R_1||R_3)]+R_1}Vdd + \frac{R_1||[R_2+(R_1||R_3)]}{R_1||[R_2+(R_1||R_3)]+R_3}\left(1+\frac{R_1||R_3}{(R_1||R_3)+R_2}\right)Vb. \quad (13)$$

The minimum voltage value of the output swing Vmin may be provided by:

$$V\text{min}(out, outb) = \left(\frac{R_3||[R_2+(R_1||R_3)]}{R_3||[R_2+(R_1||R_3)]+R_1}\right)\left(\frac{R_1||R_3}{(R_1||R_3)+R_2}\right)Vdd + \frac{R_1||[R_2+(R_1||R_3)]}{R_1||[R_2+(R_1||R_3)]+R_3}\left(1+\frac{R_1||R_3}{(R_1||R_3)+R_2}\right)Vb \quad (14)$$

The common mode voltage Vcm_out and the differential mode Vdiff_out may also be provided by:

$$\text{Vcm\_out} = (V\text{max}(out, outb) + V\text{min}(out, outb))/2 = \quad (15)$$
$$\left(\frac{R_3||[R_2+(R_1||R_3)]}{R_3||[R_2+(R_1||R_3)]+R_1}\right)\left(1+\frac{R_1||R_3}{(R_1||R_3)+R_2}\right)\frac{Vdd}{2} +$$
$$\frac{R_1||[R_2+(R_1||R_3)]}{R_1||[R_2+(R_1||R_3)]+R_3}\left(1+\frac{R_1||R_3}{(R_1||R_3)+R_2}\right)Vb$$

$$\text{Vdiff\_out} = (V\text{max}(out, outb) - V\text{min}(out, outb))/2 = \quad (16)$$
$$\left(\frac{R_3||[R_2+(R_1||R_3)]}{R_3||[R_2+(R_1||R_3)]+R_1}\right)\left(1-\frac{R_1||R_3}{(R_1||R_3)+R_2}\right)\frac{Vdd}{2}.$$

Figure 14A:
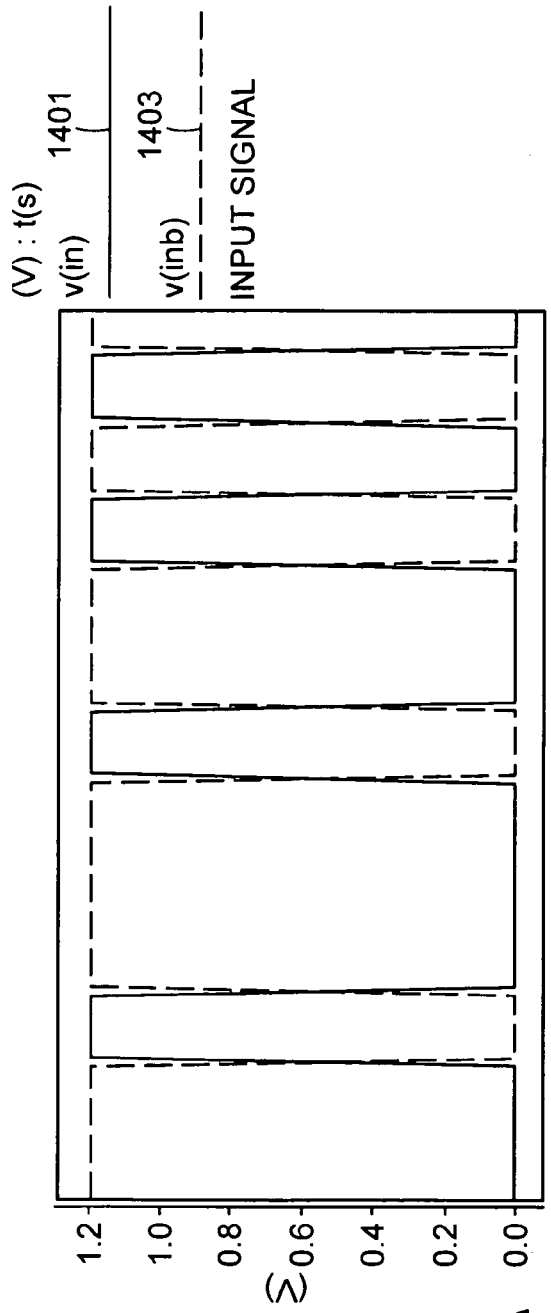
FIGS. 14A, 14B, 15A and 15B illustrate simulation results of the SE2DC of FIGS. 13A and 13B.
Figure 14B:
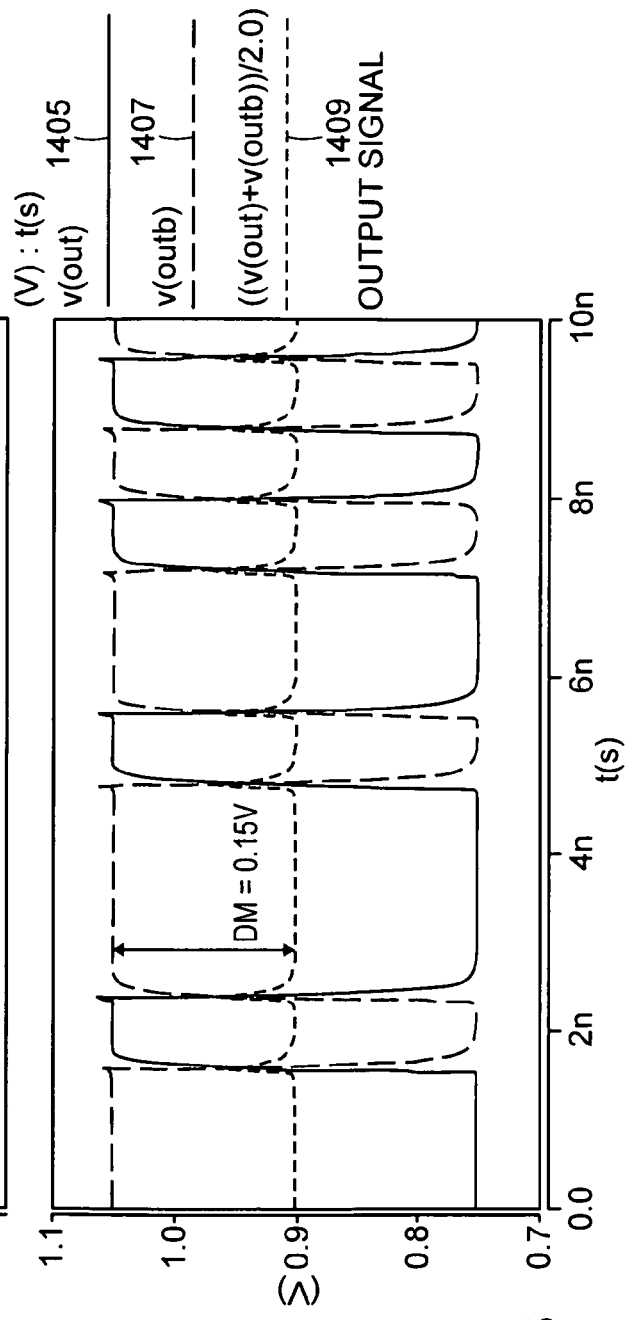

FIGS. 14A and 14B illustrate an example of an input signal and an output signal, respectively, that may be obtained using the SE2DC circuit of FIG. 13A or 13B. Both the input and output signals of FIGS. 14A and 14B, respectively, are graphically depicted in terms of voltage (y-axis) and time (x-axis). The single-ended input signal includes two inverse components V(in) 1401 and V(inb) 1403 having a single-ended swing ranging from 0V (ground) to 1.2V (Vdd). The resulting differential output signal, which may be described by equations (13)-(16), also includes two inverse components V(out) 1405 and V(outb) 1407 having a differential swing ranging from 0.75V (Vmin) to 1.05V (Vmax). The common mode voltage 1409 is also plotted in FIG. 14B and is approximately 0.9V which is greater than half of the source voltage Vdd. The differential mode voltage (DM) has a value of 0.15V. Note that the results of FIG. 14B are also provided with an matched resistance therefore $R_1=R_2=R_3$.

Figure 15A:
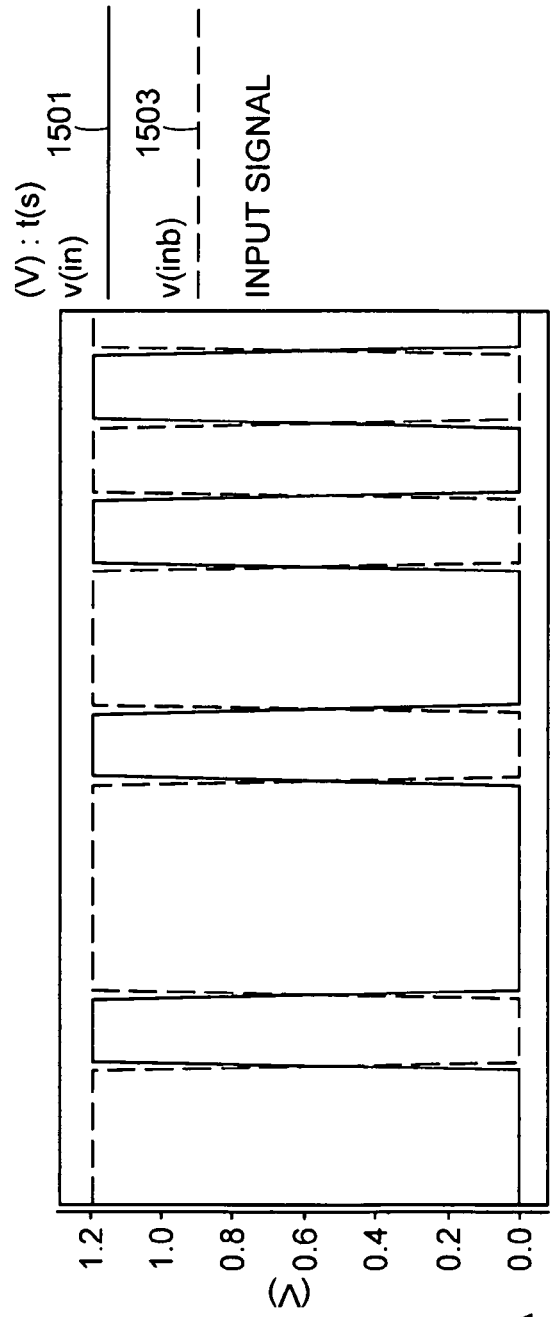
Figure 15B:
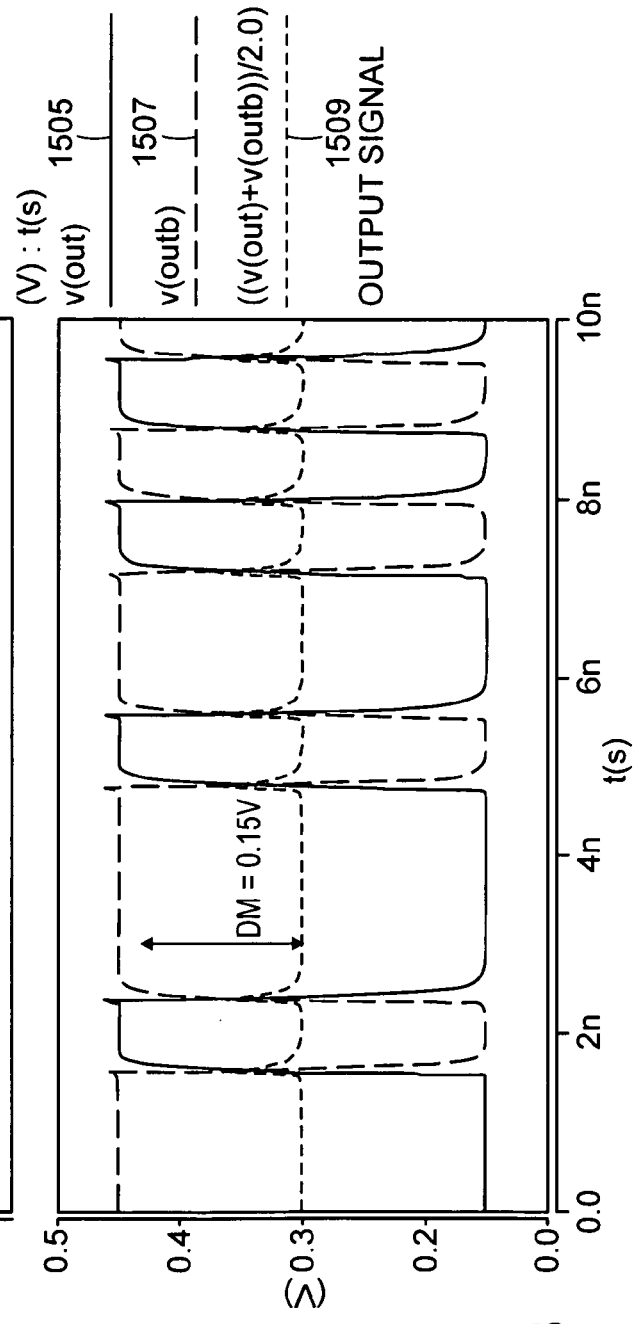

FIGS. 15A and 15B illustrate another example of an input signal and an output signal, respectively, that may be obtained using the SE2DC circuit of FIG. 13A or 13B. Both the input and output signals of FIGS. 15A and 15B, respectively, are graphically depicted in terms of voltage (y-axis) and time (x-axis). The single-ended input signal includes two inverse components V(in) 1501 and V(inb) 1503 having a differential swing ranging from 0V (ground) to 1.2V (Vdd). The resulting differential output signal, which may be described by equations (13)-(16), also includes two inverse components V(out) 1505 and V(outb) 1507 having a differential swing ranging from 0.15V (Vmin) to 0.45V (Vmax). The common mode voltage 1509 is also plotted in FIG. 15B and is approximately 0.3V which is less than half of the source voltage Vdd. The differential mode voltage (DM) has a value of 0.15V. Note that the results of FIG. 15B are also provided with an matched resistance therefore $R_1=R_2=R_3$.

Figure 16:
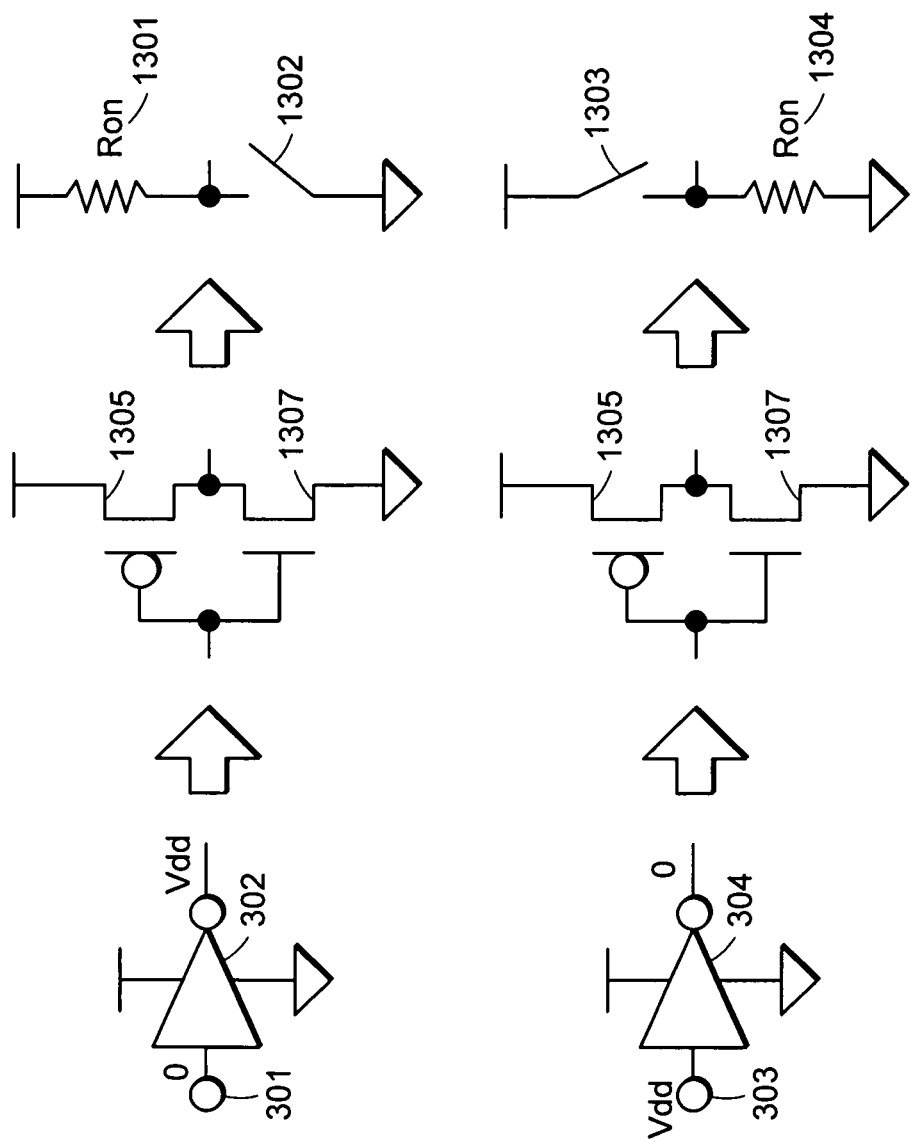
FIG. 16 illustrates a resistive model of an inverter.

It should be appreciated that the inverters 302 and 304 of FIGS. 3A, 3D, 4A, 4B, 7, 9A-9D, and/or 10 may be modeled as MOS switches as illustrated in FIG. 16. Both inverters 302 and 304 may be modeled as a pair of MOS devices, including a PMOS 1305 and an NMOS 1307 transistor device. When either inverter 302 or 304 pulls down towards ground (0V), the NMOS 1307 output resistance may be model as a resistor $R_{on}$ controlled via a switch. Similarly, when either inverter 302 or 304 is pulling up towards Vdd, the PMOS 1305 linear resistance may also be modeled as a resistor $R_{on}$ controlled via a switch. FIG. 16 illustrates the inverter 302 being modeled by a resistor $R_{on}$ 1301 controlled via a switch 1302 and the inverter 304 being modeled by a resistor $R_{on}$ 1303 controlled via a switch 1304. The resistive values of the PMOS 1305 and NMOS 1307 may be scaled by altering the width and lengths of the MOS devices.

Figure 17:
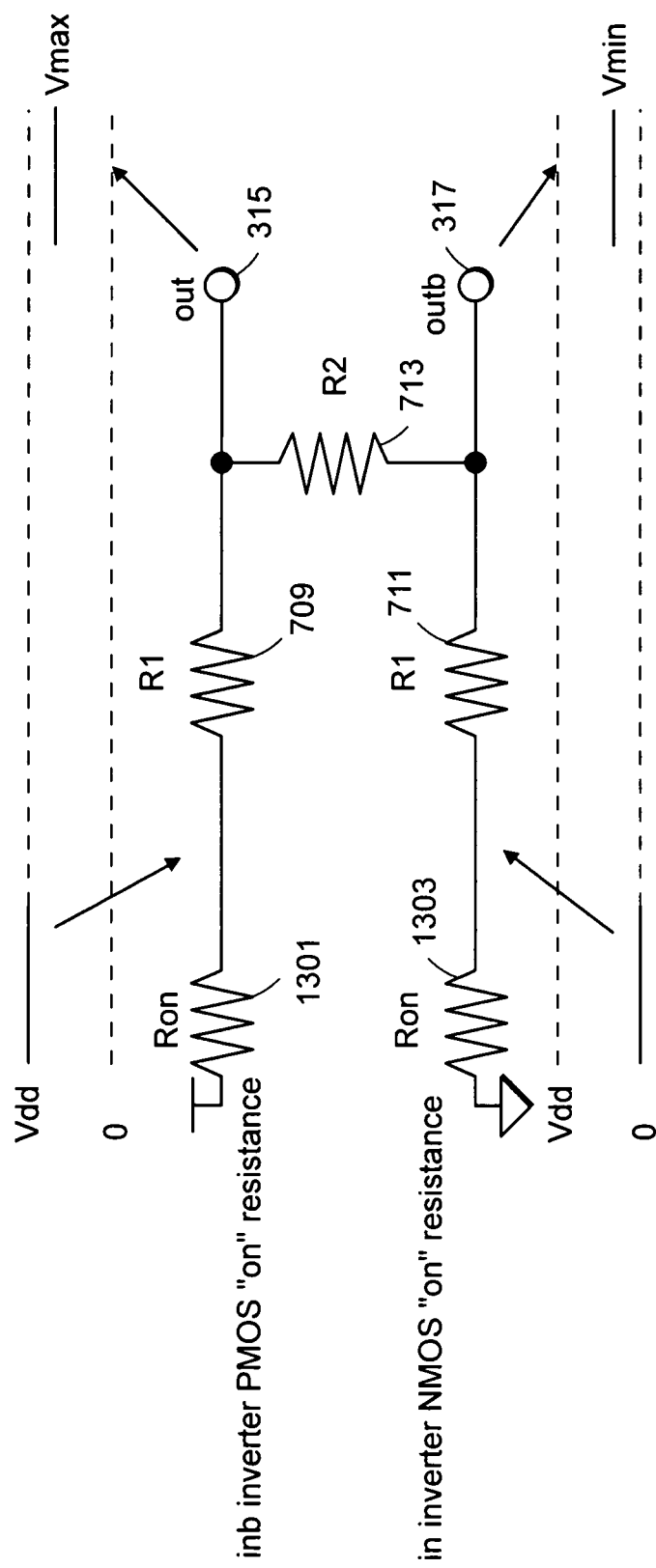
FIG. 17 is a schematic of an alternative design of a SE2DC featuring the resistive model of FIG. 16 and illustrates how a MOS invert resistance may impact SE2DC performance, according to example embodiments.

FIG. 17 illustrates the SE2DC circuit of FIG. 7 featuring the modeled resistance $R_{on}$ 1301 and 1303 in the place of inverters 302 and 304, respectively. For simplicity, switches 1302 and 1304 have been omitted from FIG. 17. Furthermore, it is assumed that the PMOS 1305 and NMOS 1307 devices have been dimensioned to provide the same resistance value of $R_{on}$. Recalculating the relevant voltages, the output voltage may be defined by:

$$V\text{max(out, outb)} = \frac{(1+\alpha)R_1 + R_{on}}{(2+\alpha)R_1 + 2R_{on}} Vdd \quad (17)$$

$$V\text{min(out, outb)} = \frac{R_1 + R_{on}}{(2+\alpha)R_1 + 2R_{on}} Vdd. \quad (18)$$

The common mode output voltage Vcm_out and the differential mode Vdiff may be defined as:

$$V\text{cm\_out} = (V\text{max(out, outb)} + V\text{min(out, outb)})/2 = \frac{Vdd}{2}, \quad (19)$$

$$V\text{diff\_out} = \quad (20)$$
$$(V\text{max(out, outb)} - V\text{min(out, outb)})/2 = \frac{\alpha R_1}{2((2+\alpha)R_1 + 2R_{on})} Vdd.$$

As the resistive value of $R_{on}$ 1301 and 1302 is made small relative to $R_1$ 709 and $R_2$ 711, the error that may be introduced by a driver in regards to resistance may be correspondingly small. For example, if $\alpha \geq 1$, and $R_1 \geq 10 \cdot R_{on}$, the error introduced by a finite $R_{on}$ may be less than 3.5%. Larger values of $\alpha$ and $R_1/R_{on}$ may reduce the error further.

Various embodiments of a SE2DC featuring a passive network of resistive elements has been discussed. An advantage of the various SE2DC embodiments discussed is that the entire SE2DC may be included in a single stage, thereby reducing the complexity and overall cost of the device. Furthermore, the various embodiments discussed allow for precise adjustments of the common and differential mode output voltages.

Another advantage of the various embodiments is that the output swing and common mode of the described devices may not be altered in the presence of high resistance MOS differential input stages. MOS differential input stages are typically used in integrated circuit design, and may be represented as a typical load for the SE2DC. Because the SE2DC embodiments are constructed based on a resistive element network, resistive loading at the output could potentially alter the desired values of the output swing and common mode. However, because the high resistance MOS input stages are presented as loads, there minimal impact of the differential stage on the SE2DC outputs. Even in fine feature size modern nodes that exhibit MOS gate leakage, the leakage values for typical differential amplifier gates, of the MOS input stage, will be very small compared to the active current through the resistor network included in the various SE2DC embodiments. Therefore, by taking advantage of the inherent high input impedance present in differential stages of the MOS input, a single stage, low distortion, well-matched, linear resistive network may be provided as an equivalent circuit.

A further advantage of the various SE2DC embodiments that include resistors as the resistive elements is that the resistive network of the SE2DC may be unaffected by the high input impedances of typical MOS input stages. Specifically, these single-ended to differential converter circuits are capable of achieving process and temperature independent output common modes and differential amplitudes in a single stage.

While this invention has been particularly shown and described with references to example embodiments thereof, it will be understood by those skilled in the art that various changes in form and details may be made therein without departing from the scope of the invention encompassed by the appended claims.

What is claimed is:

1. A single-ended to differential converter comprising:
   at least one input node configured to receive a full-swing single-ended signal;
   at least one output node configured to emit a low-swing differential signal; and
   a single-stage circuit coupled between the at least one input and output nodes, the single-stage circuit comprising a configured fully passive network including a plurality of resistive elements and configured to convert the full-swing single-ended signal to the low-swing differential signal.

2. The converter of claim 1 wherein at least one of the plurality of resistive elements is a resistor.

3. The converter of claim 1 wherein at least one of the plurality of resistive elements is a MOS device operating in a linear region.

4. The converter of claim 1 wherein at least one of a common mode, differential amplitude, and output swing of the low-swing differential signal is tunable by adjusting a ratio with respect to at least a portion of the plurality of resistive elements.

5. The converter of claim 1 wherein the single-stage circuit further includes at least one variable current source in connection with the configured fully passive network for defining a common mode voltage of the low-swing differential signal.

6. The converter of claim 5 wherein the variable current source includes at least one setting resistive element connected to a voltage source, the at least one setting resistive element configured to provide a decrease to a common mode of the low-swing differential signal to an amount less than half of a high voltage of the full-swing single-ended signal.

7. The converter of claim 1 wherein the plurality of resistive elements includes at least one setting resistive element connected to a voltage source, the at least one setting resistive element configured to provide an increase to a common mode of the low-swing differential signal to an amount greater than half of a high voltage of the full-swing single-ended signal.

8. The converter of claim 5 wherein the at least one variable current source is a resistor.

9. The converter of claim 5 wherein the at least one variable current source is a MOS device.

10. The converter of claim 1 wherein the single-stage circuit includes:
   two receiving resistive elements in connection with the at least one input node;
   at least one emitting resistive element in connection with the at least one output node, the two receiving resistive elements and the at least one emitting resistive elements forming the configured fully passive network; and
   at least one variable current source in connection with the configured fully passive network for defining a common mode voltage of the low-swing differential signal.

11. The converter of claim 1 wherein the single-stage circuit includes:
   two receiving banks of resistive elements, configured to provide an adjustable resistance, in connection with the least one input node;
   at least one emitting bank of resistive elements, configured to provide an adjustable resistance, in connection with the at least one output node, the two receiving banks of resistive elements and the at least one emitting bank of resistive elements configured to form the configured fully passive network; and
   at least one variable current source in connection with the configured fully passive network for defining a common mode voltage of the low-swing differential signal.

12. The converter of claim 1 wherein the configured fully passive network is configured to convert the full-swing single-ended signal to the low-swing differential with a predetermined differential amplitude and common mode voltage.

13. A method of providing a single-ended to differential converter, the method comprising:
   receiving a full-swing single-ended signal in at least one input node;
   emitting a low-swing differential signal through at least one output node; and
   converting the full-swing single-ended signal to the low-swing differential signal within a single-stage circuit coupled between the at least one input and output nodes, the single-stage circuit comprising a configured fully passive network including a plurality of resistive elements.

14. The method of claim 13 wherein at least one of the plurality of resistive elements is a resistor.

15. The method of claim 13 wherein at least one of the plurality of resistive elements is a MOS device operating in a linear region.

16. The method of claim 13 further including defining at least one of a common mode, a differential amplitude, and an output swing of the low-swing differential signal by adjusting a ratio with respect to at least a portion of the plurality of resistive elements.

17. The method of claim 13 further including adjusting a common mode, of the low-swing differential signal, to a value greater than half of a high voltage of the full-swing single-ended signal via at least one variable current source.

18. The method of claim 13 further including adjusting a common mode, of the low-swing differential signal, to a value greater than half of a high voltage of the full-swing single-ended signal via at least one variable current source.

19. A single-ended to differential converter comprising:
   at least one input node configured to receive a full-swing single-ended signal;
   at least one output node configured to send a low-swing differential signal;
   a configured fully passive single-stage circuit featuring a network of a plurality of resistive elements coupled between the at least one input and output nodes, the single-stage circuit configured to convert the full-swing single-ended signal to the low-swing differential signal.

20. The converter of claim 19 wherein at least one resistive element of the plurality of resistive elements is a resistor.

21. The converter of claim 19 wherein at least one resistive element of the plurality of resistive elements is a MOS device operating in a linear region.

22. The converter of claim 19 wherein the configured fully passive single-stage circuit includes at least one resistive element configured to set a common mode of the low-swing differential signal.

23. The converter of claim 19 wherein the plurality of resistive elements includes at least one configured bank of resistive elements providing an adjustable resistance.

24. A single-ended to differential converter comprising:
   means for receiving a full-swing single-ended signal;
   means for emitting a low-swing differential signal; and
   means for converting the full-swing single-ended signal to the low-swing differential signal within a single-stage circuit, the single-stage circuit comprising a configured fully passive network including a plurality of resistive elements.

* * * * *